United States Patent [19]
Matsui

[11] Patent Number: 5,953,280
[45] Date of Patent: Sep. 14, 1999

[54] BANK SELECTION FOR SYNCHRONOUS READABLE AND WRITABLE SEMICONDUCTOR MEMORY

[75] Inventor: Yoshinori Matsui, Tokyo, Japan

[73] Assignee: NEC Corporation, Japan

[21] Appl. No.: 08/824,085

[22] Filed: Mar. 24, 1997

[30] Foreign Application Priority Data

Mar. 25, 1996 [JP] Japan ................................. 8-068584

[51] Int. Cl.$^6$ ........................................................ G11C 8/00
[52] U.S. Cl. .................................. 365/230.03; 365/185.11
[58] Field of Search ......................... 365/230.01, 230.03, 365/185.11

[56] References Cited

U.S. PATENT DOCUMENTS

| | | | |
|---|---|---|---|
| 5,469,391 | 11/1995 | Haraguchi | 365/200 |
| 5,535,169 | 7/1996 | Endo et al. | 365/230.03 |
| 5,553,026 | 9/1996 | Nakai et al. | 365/201 |

OTHER PUBLICATIONS

"A 150MHz 8–Banks 256M Synchronous DRAM with Wave Pipelining Methods"; Yoo et al 1995 IEEE International Solid–State Circuites Conference; Feb. 17, 1995; pp. 250–251.

Primary Examiner—David C. Nelms
Assistant Examiner—Hoai V. Ho
Attorney, Agent, or Firm—Hayes, Soloway, Hennessey, Grossman & Hage, P.C.

[57] ABSTRACT

In a synchronous DRAM having a memory cell array which is constituted of first to fourth memory banks but which can be selectively operated either in a 2-bank structure or in a 4-bank structure, a bank control signal generating unit receives external active command signals including a $\overline{RAS}$ command signal, a $\overline{CAS}$ command signal, a $\overline{WE}$ command signal and the $\overline{CS}$ command signal, and external bank selection signals, for generating first to fourth read/write bank selection signals and first to fourth bank activation signals. An address signal generating unit receives external address signals, for generating an internal row address signal and an internal column address to the memory cell array. The bank control signal generating unit is configured to selectively operate at least one memory bank in a data read/write operation without receiving an external bank switching signal having a function of switching the number of memory banks.

7 Claims, 13 Drawing Sheets

BANK SELECTION FOR SYNCHRONOUS READABLE AND WRITABLE SEMICONDUCTOR MEMORY

BACKGROUND OF THE INVENTION

1. Field of the invention

The present invention relates to a semiconductor memory, and more specifically to a synchronous DRAM (dynamic random access memory) having a plurality of banks constituting a memory cell array and a function of selecting a bank to be read, written and precharged, from the plurality of banks.

2. Description of Related Art

In a semiconductor memory operating at a high speed, which is generally called a synchronous DRAM, performance is evaluated on the basis of the amount of data which can be read and written in a constant time. Therefore, in order to eliminate a loss time which corresponds to a precharging time of the memory cell array inherent to the DRAM and which also corresponds to a gap occurring between continuous data inputtings/outputtings, it is a conventional practice to divide the memory cell array into some number of groups and to provide one control circuit for each of the groups independently of the other groups to the effect that the groups of the memory cell array are alternatively read and written. Thus, the loss time in the data inputtings/outputtings can be equivalently eliminated. Ordinarily, each of the groups obtained by dividing the memory cell array is called a "memory bank" or simply a "bank". A synchronous DRAM having $2^N$ banks (where N is positive integer), typified by 2 banks, 4 banks, or 8 banks, has been already developed. In the following, each of the groups of the memory cell array will be called simply a "bank". The number of banks depends upon a demand in an application, and in the prior art, a circuit construction has been adopted which can selectively operate with different bank number structures (for example, a 2-bank structure and a 4-bank structure) in a chip of the same design, so as to meet with a demand of a different bank number.

Now, one prior art example of the synchronous DRAM, which can selectively operate with either 2-bank structure or a 4-bank structure, will be described with reference to the drawings.

First, operation of the prior art example in the 4-bank structure will be described. In the following, a data reading operation will be described, but explanation of a data writing operation will be omitted for simplification of description, since a bank selection operation and a bank activation operation in the data writing operation are the same as those of the data reading operation.

Referring to FIG. 1, there is shown a block diagram of the prior art example of the synchronous DRAM. As shown in FIG. 1, the prior art synchronous DRAM includes a bank control signal generating unit 600 receiving a pair of bank selection signals 200 and 201, a $\overline{RAS}$ (row address strobe) command signal 240, a $\overline{CAS}$ (column address strobe) command signal 241, a $\overline{WE}$ (write enable) command signal 242 and a $\overline{CS}$ (chip select) command signal 243 (which are called an "active command signal"), and a predetermined bank switching signal 248, and for generating an internal activation command signal 205, an internal read/write command signal 207, bank activation signals 220, 221, 222 and 223 and read/write bank selection signals 224, 225, 226 and 227. The shown synchronous DRAM also includes an address signal generating unit 102 receiving address signals Ai (i=1, 2, . . . , n) (bus 244), and for generating internal row address signals Xi (bus 245) and internal column address signals Yi (bus 246), and a memory cell array 101 receiving the signals outputted from the bank control signal generating unit 600 and the address signal generating unit 102, for supplying and receiving a read/write data through a data input/output unit 103.

Referring to FIG. 2, the memory cell array 101 is divided into four banks 700, 701, 702 and 703 each including a group of memory cells and a control circuit associated therewith. Each of the four banks 700, 701, 702 and 703 is coupled to receive the internal row address signals Xi, 245 and the internal column address signals Yi, 246, and is connected to an input/output data bus 704, which is connected to the input input/output unit 103, for the purpose of outputting the read data and receiving data to be written. In addition, the bank 700 receives the bank activation signal 220 and the read/write bank selection signal 224, and the bank 701 receives the bank activation signal 221 and the read/write bank selection signal 225. The bank 702 receives the bank activation signal 222 and the read/write bank selection signal 226, and the bank 703 receives the bank activation signal 223 and the read/write bank selection signal 227.

Referring to FIG. 3, there is shown a block diagram illustrating a portion of an internal construction of each of the banks 700, 701, 702 and 703. The banks 700, 701, 702 and 703 have the same construction and operate in the same manner. The shown bank includes a latch signal generating circuit 822 receiving the corresponding bank activation signal 220–223, decode circuit blocks 800, 801 and 802 each including an AND gate receiving the internal row address signals Xi (bus 245), and a D-latch circuit 805 having a data input D connected to an output of the AND gate 832 and a gate control input G connected to an output of the latch signal generating circuit 822.

The shown bank also includes a row decode circuit 803 having a word line driver (AND circuit) 806 receiving an output of the decode circuit blocks 800, 801 and 802 through internal row address bus lines 804 and the corresponding bank activation signal 220–223, a word line 807 connected to an output of the word line driver 807, a memory cell 808 included in the memory cell array of the corresponding bank and connected to the word line 807 and a digit line 809, and a sense amplifier 811 connected between a pair of complementary digit lines 809 and 810 and enabled by the corresponding bank activation signal 220–223.

The shown bank furthermore includes a column decode circuit 812 having a column switch driver (AND circuit) 813 receiving the internal column address signals Yi (bus 246) and the corresponding read/write bank selection signal 224–227, and a column switch circuit 814 composed of MOS transistors 815, 816, 817 and 818 connected as shown. The MOS transistors 815 and 816 are connected in series between one of a pair of complementary reading bus lines 819 and 820 and ground, and the MOS transistors 817 and 818 are connected in series between the other reading bus line 820 and ground. A gate of the MOS transistors 815 and 817 are connected in common to an output of the column switch driver 813. A gate of the MOS transistors 816 and 818 are connected to the pair of complementary digit lines 809 and 810, respectively. The pair of complementary reading bus lines 819 and 820 are connected to a pair of complementary inputs of a data amplifier circuit 821 enabled by the corresponding read/write bank selection signals 224–227 and having an output connected to the input/output data line 704. As well known to persons skilled in the art, actually, a number of memory cells are arranged to form a memory cell matrix having a number of rows and a number of columns. Therefore, a number of word lines and a number of digit lines are actually provided, so that, there are provided the decode circuit blocks of the corresponding number, the word line drivers of the corresponding number, the sense amplifiers of the corresponding number, the column switch drivers of the corresponding number, the column switches of the corresponding number and the data amplifiers of the corresponding number. However, for simplification of the drawings, only the decode circuit blocks 800, 801 and 802, one word line 807, one memory cell 808, the pair of digit lines 809 and 810, one sense amplifier 811, one column switch driver 813, one column switch 814, and one data amplifier 821 are shown in FIG. 3. In addition, since an internal construction and an operation of each of the decode circuit blocks 801 and 802 are the same as that of the decode circuit block 800, the internal construction of each of the decode circuit blocks 801 and 802 is omitted in FIG. 3 for simplification of drawing.

Referring to FIG. 4, there is shown a block diagram illustrating an internal construction of the bank control signal generating unit 600. The shown bank control signal generating unit 600 includes clocked buffer circuits 212, 213, 214 and 215 receiving the $\overline{\text{RAS}}$ command signal 240, the $\overline{\text{CAS}}$ command signal 241, the $\overline{\text{WE}}$ command signal 242 and the $\overline{\text{CS}}$ command signal 243, respectively, and controlled in common by an internal clock signal 230, a command decode circuit 204 receiving an output of the clocked buffer circuits 212, 213, 214 and 215, for generating the internal activation command signal 205, an internal precharge signal 206 and the internal read/write command signal 207, and clocked buffer circuits 210 and 211 receiving the bank selection signals 200 and 201, respectively, and controlled in common by the internal clock signal 230 for generating internal bank selection signals 208 and 209, respectively.

The shown bank control signal generating unit 600 also includes a bank activation signal generating circuitry 900 receiving the internal bank selection signals 208 and 209, the bank switching signal 248 supplied from an external, the internal activation command signal 205, and the internal precharge signal 206, for generating the bank activation signals 220, 221, 222 and 223 for the four banks 700, 701, 702 and 703, respectively, and a 1 5 read/write bank selection signal generating circuitry 901 receiving the bank activation signals 220, 221, 222 and 223, the internal bank selection signals 208 and 209, the internal read/write command signal 207, and the bank switching signal 248, for generating the bank selection signals 224, 225, 226 and 227 for the four banks 700, 701, 702 and 703, respectively.

Referring to FIG. 5, there is shown a timing chart illustrating an operation of the synchronous DRAM in the 4-bank structure. The synchronous DRAM operates completely in synchronism with a clock signal, and an input signal is latched and internally fetched in synchronism with a rising edge of the clock signal. The operation of the synchronous DRAM is determined by a combination of the $\overline{\text{RAS}}$ command signal 240, the $\overline{\text{CAS}}$ command signal 241, the $\overline{\text{WE}}$ command signal 242 and the $\overline{\text{CS}}$ command signal 243. In the timing chart of FIG. 5, "ACT" at a timing T1 is determined by a specific logical value combination of the $\overline{\text{RAS}}$ command signal 240, the $\overline{\text{CAS}}$ command signal 241, the $\overline{\text{WE}}$ command signal 242 and the $\overline{\text{CS}}$ command signal 243, which are called the active commands. This active command "ACT" corresponds to a falling of the $\overline{\text{RAS}}$ command signal 240 in a conventional DRAM, and in response to this active command, the address signals Ai, 244 and the bank selection signals 200 and 201 are fetched, so that the activation signal for the bank selected by the bank selection signals 200 and 201 is generated, and a corresponding memory cell is activated. The bank selection signals are used for select a bank to be selected. In the 4-bank structure, therefore, one bank is selected by a logical value combination of two bits (corresponding to the bank selection signals 200 and 201). In this case, when both of the logical values of the bank selection signals 200 and 201 are at a logical low level, the bank 700 is selected, and when the logical values of the bank selection signals 200 and 201 are at a logical high level and at the logical low level, respectively, the bank 701 is selected. When the logical values of the bank selection signals 200 and 201 are at the logical low level and at the logical high level, respectively, the bank 702 is selected, and when both of the logical values of the bank selection signals 200 and 201 are at the logical high level, the bank 703 is selected.

In the circuit of FIG. 4, the bank selection signals 200 and 201 are latched in the buffer circuits 210 and 211 in response to the internal clock signal 230, and are outputted as the internal bank selection signals 208 and 209 to the bank activation signal generating circuitry 900 and the read/write bank selection signal generating circuitry 901. At the timing T1 shown in FIG. 5, both the internal bank selection signals 208 and 209 are outputted at the logical low level corresponding to the logical low level of the bank selection signals 200 and 201. On the other hand, the active command signals including the $\overline{\text{RAS}}$ command signal 240, the $\overline{\text{CAS}}$ command signal 241, the $\overline{\text{WE}}$ command signal 242 and the $\overline{\text{CS}}$ command signal 243, are supplied through the buffer circuits 212, 213, 214 and 215 to the command decode circuit 204, and decoded to generate the internal activation command signal 205, the internal precharge signal 206 and the internal read/write command signal 207. The internal activation command signal 205 and the internal precharge signal 206 are supplied to the bank activation signal generating circuitry 900, and the internal read/write command signal 207 is supplied to the read/write bank selection signal generating circuitry 901. In this case, the internal activation command signal 205 outputted from the command decode circuit 204 in response to the active command signals is brought into the logical high level.

Referring to FIGS. 6A, 6B, 6C and 6D, there are shown examples of an internal construction of the bank activation signal generating circuitry 900 of the prior art constructed to be able to operate in the 4-bank structure. The bank activation signal generating circuitry 900 includes four, namely, first, second, third and fourth bank activation signal generating circuits shown in FIGS. 6A, 6B, 6C and 6D, respectively, for generating the bank activation signals 220, 221, 222 and 223 for the banks 700, 701, 702 and 703, respectively.

The first bank activation signal generating circuit shown in FIG. 6A for generating the bank activation signal 220, includes inverters 1003, 1005 and 1025, a NAND gate 1006, AND gates 1000 and 1001, and NOR gates 1002 and 1004, which are connected as shown. The second bank activation signal generating circuit shown in FIG. 6B for generating the bank activation signal 221, includes inverters 1010 and 1026, a NAND gate 1012, AND gates 1007 and 1008, and NOR gates 1009 and 1011, which are connected as shown. The third bank activation signal generating circuit shown in FIG. 6C for generating the bank activation signal 222, includes inverters 1016, 1018 and 1027, a NAND gate 1028, AND gates 1013 and 1014, and NOR gates 1015 and 1017, which are connected as shown. The fourth bank activation signal generating circuit shown in FIG. 6D for generating the bank activation signal 223, includes inverters 1022 and 1029, a NAND gate 1030, AND gates 1019 and 1020 and NOR gates 1021 and 1023, which are connected as shown.

At the timing T1 shown in FIG. 5, both the logical low level of the bank selection signals 200 and 201 supplied to the bank control signal generating unit 600 are both at the logical low level, and therefore, both the internal bank selection signals 208 and 209 are also at the logical low level. Therefore, the bank 700 is selected as mentioned hereinbefore. In the 4-bank structure operation, on the other hand, the bank switching signal 248 of the logical high level is supplied from the external to the first bank activation signal generating circuit shown in FIG. 6A for the bank 700. Here, it is a conventional practice that the bank switching signal 248 is fixed to either the logical high level or the logical low level in a product manufacturing process. In addition, the internal precharge command signal 206 is set to the logical low level.

Now, assume that all the bank activation signals 220, 221, 222 and 223 outputted from the bank activation signal generating circuits are initially at the logical low level. In the first bank activation signal generating circuit shown in FIG. 6A, if the internal activation command signal 205 is brought to the high level at the timing T1, since both the internal bank selection signals 208 and 209 are at the logical low level, an output of the AND gate 1000 is brought to the logical high level, and an output of the NOR gate 1002 is brought to the logical low level, so that an output of the inverter 1003 is brought to the logical high level, with the result that the bank activation signal 220 is brought to the logical high level. On the other hand, since the internal precharge command signal 206 is at the logical low level, an output of the AND gate 1001 is at the logical low level. As mentioned above, since the output of the NOR gate 1002 is at the logical low level, an output of the NOR gate 1004 is brought to the logical high level. Therefore, the output of the NOR gate 1002 is maintained at the logical high level, regardless of the output level of the AND gate 1000. Thus, the bank activation signal 220 is maintained at the logical high level.

At a rising of the clock signal in a timing T2 shown in FIG. 5, the active command signals including the $\overline{RAS}$ command signal 240, the $\overline{CAS}$ command signal 241, the $\overline{WE}$ command signal 242 and the $\overline{CS}$ command signal 243, are supplied through the buffer circuits 212, 213, 214 and 215 to the command decode circuit 204 and the internal activation command signal 205 outputted from the command decode circuit 204 is brought to the logical low level. Accordingly, the output of the AND gate 1000 is brought to the logical low level.

On the other hand, the address signal generating unit 102 receiving the address signals Ai, 244, fetches the address signal in response to the internal activation command signal 205 of the logical high level at the timing T1 shown in FIG. 5, and outputs the internal row address signal Xi, 245 to the memory cell array 101. The row address value indicated by the internal row address signal Xi, 245 corresponding to the address signals Ai, 244, at the timing T1 is shown as "ROW1" in FIG. 5.

Here, the address signal generating unit 102 comprises a clocked buffer circuit 216 and D-latch circuits 501 and 502, connected as shown in FIG. 7. The address signal Ai, 244 is supplied through the buffer circuit 216 controlled by the clock signal 230, to a data input D of each of the D-latch circuits 501 and 502. In response to the internal activation command signal 205 supplied to a gate control input G of the D-latch circuit 501, the address signal Ai, 244 is fetched in the D-latch circuit 501, which in turn outputs the internal row address signal Xi, 245. On the other hand, in response to the internal read/write command signal 207 supplied to a gate control input G of the D-latch circuit 502, the address signal Ai, 244 is fetched in the D-latch circuit 502, which in turn outputs the internal column address signal Yi, 246.

The clocked buffer circuit 210 to 215 shown in FIG. 4 and the clocked buffer circuit 216 shown in FIG. 7 are constructed as shown in FIG. 8. Namely, the clocked buffer circuit includes an input signal receiver circuit 1200 receiving an input signal, and a D-type flipflop circuit 1201 having a data input D connected to an output of the input signal receiver circuit 1200 and a clock input C connected to receive the internal clock signal 230. Thus, the input signal is supplied through the input signal receiver circuit 1200 to the D-type flipflop circuit 1201 and is latched in the D-type flipflop circuit 1201 in synchronism with the internal clock signal 230, so that the latched signal is outputted from an output Q of the D-type flipflop circuit 1201.

The bank activation signal 220 outputted from the first bank activation signal generating circuit shown in FIG. 6A and the internal row address signal Xi, 245 supplied from the address signal generating unit 102, are supplied to the bank 700, as shown in FIG. 2. The bank activation signal 220 is supplied to the latch signal generating circuit 822 shown in the block diagram of FIG. 3 illustrating the internal construction of each bank. At a transition of the logical low level to the logical high level of the bank activation signal 220, a latch signal 822A is generated in the latch signal generating circuit 822, and supplied to the gate control input G of the D-latch circuit 805 included in each of the decode circuit blocks 800, 801 and 802.

On the other hand, the internal row address signals Xi, 245 are supplied to the AND gate 832 included in each of the decode circuit blocks 800, 801 and 802, and a logical product output of the AND gate 832 is supplied to the data input D of the D-latch 805. Thus, in each of the decode circuit blocks 800, 801 and 802, a first stage of a decoding processing for the internal row address signals Xi, 245 is executed, and the internal row address signals Xi, 245 are latched in response to the latch signal 822A generated in the latch signal generating circuit 822. The internal row address signals Xi, 245 decoded in the decode circuit blocks 800, 801 and 802, are supplied to the row decode circuit 803.

In this row decode circuit 803, the word line driver 806 brings to the logical high level the word line 807 selected by the bank activation signal 220 and the internal row address signals Xi, 245. The sense amplifier 811 is also activated in response to the bank activation signal 220. Thus, data read from the memory cell 808 to the digit lines 809 and 810 because the word line 807 has been brought to the logical high level, is amplified by the sense amplifier 811.

At a timing T3 in the timing chart of FIG. 5, the active command signals including the $\overline{RAS}$ command signal 240, the $\overline{CAS}$ command signal 241, the $\overline{WE}$ command signal 242 and the $\overline{CS}$ command signal 243, are supplied through the buffer circuits 212, 213, 214 and 215 to the command decode circuit 204. In addition, in response to the bank selection signal 200 of the logical low level and the bank selection signal 201 of the logical high level, the internal bank selection signal 208 of the logical low level and the internal bank selection signal 209 of the logical high level are supplied to the bank activation signal generating circuitry 900 and the read/write bank selection signal generating circuitry 901.

As mentioned hereinbefore, when the internal bank selection signals 208 and 209 are at the logical low level and at the logical high level, respectively, the bank 702 is selected and activated. If the internal activation command signal 205 supplied to the bank activation signal generating circuitry 900 shown in FIG. 4 is at the logical high level, an output of the AND gate 1013 in the third bank activation signal generating circuit shown in FIG. 6C for the bank 702, is brought to the logical high level. Therefore, an output of the NOR gate 1015 is brought to the logical low level, so that an output of the inverter 1016 is brought to the logical high level, with the result that the bank activation signal 222 is brought to the logical high level. On the other hand, since the internal precharge command signal 206 is at the logical low level, an output of the AND gate 1014 is at the logical low level. As mentioned above, since the output of the NOR gate 1015 is at the logical low level, an output of the NOR gate 1017 is brought to the logical high level. Therefore, the output of the NOR gate 1015 is maintained at the logical low level, regardless of the output level of the AND gate 1013. Thus, the bank activation signal 220 is maintained at the logical high level.

At the same time, as shown in the timing chart of FIG. 5, since the row address value "ROW2" is supplied as the internal row address signal Xi, 245, the word line 807 corresponding to the row address value "ROW2" is selected, and data of the memory cell 808 is amplified by the associated sense amplifier 811.

At a rising of the clock signal in a timing T4 shown in FIG. 5, the external active command signals are supplied through the buffer circuits 212, 213, 214 and 215 to the command decode circuit 204 and decoded by the command decode circuit 204 so that the internal activation command signal 205 is brought to the logical low level. Accordingly, at this timing, the output of the AND gate 1013 in the third bank activation signal generating circuit shown in FIG. 6C is brought to the logical low level.

What is shown as "RED" at a timing T6 in the timing chart of FIG. 5, is one called a read command, which is recognized by a specific logical value combination of the external active command signals including the $\overline{RAS}$ command signal 240, the $\overline{CAS}$ command signal 241, the $\overline{WE}$ command signal 242 and the $\overline{CS}$ command signal 243. The read command is one corresponding to a falling of the $\overline{CAS}$ command signal 241 in a conventional DRAM, and in response to this active command, the address signals Ai, 244 and the bank selection signals 200 and 201 are fetched, so that the read/write bank selection signal for the bank selected by the bank selection signals is generated, and data is read out from a column address corresponding to the address signal.

At a timing T6 in the timing chart of FIG. 5, the active command signals including the $\overline{RAS}$ command signal 240, the $\overline{CAS}$ command signal 241, the $\overline{WE}$ command signal 242 and the $\overline{CS}$ command signal 243, are supplied through the buffer circuits 212, 213, 214 and 215 to the command decode circuit 204, and decoded by the command decode circuit 204 to bring the internal read/write command signal 207 to the logical high level. Since the bank activation signals 220 and 222 outputted from the bank activation signal generating circuitry 900 at this timing T6 are at the logical high level, the bank 700 and 702 are in the activated condition. Therefore, the banks which can be read at this situation are only the banks 700 and 702. Since both the bank selection signals 200 and 201 have been brought to the logical low level at the timing T6, the bank 700 is selected. The bank selection signals 200 and 201 of the logical low level are outputted through the buffer circuits 210 and 211 as the internal bank selection signals 208 and 209 of the logical low level, respectively, and supplied to the read/write bank selection signal generating circuitry 901.

Referring to FIGS. 9A, 9B, 9C and 9D, there are shown examples of an internal construction of the read/write bank selection signal generating circuitry 901 of the prior art constructed to be able to operate in the 4-bank structure. The read/write bank selection signal generating circuitry 901 includes four, namely, first, second, third and fourth read/write bank selection signal generating circuits shown in FIGS. 9A, 9B, 9C and 9D, respectively, for generating the bank selection signals 224, 225, 226 and 227 for the banks 700, 701, 702 and 703, respectively.

The first read/write bank selection signal generating circuit shown in FIG. 9A for generating the bank selection signal 224, includes a NAND gate 1101, an AND gate 1102, a D-latch circuit 1103 and an inverter 1104, connected as shown. The second read/write bank selection signal generating circuit shown in FIG. 9B for generating the bank selection signal 225, includes a NAND gate 1110, an AND gate 1111, and a D-latch circuit 1112, connected as shown. The third read/write bank selection signal generating circuit shown in FIG. 9C for generating the bank selection signal 226, includes a NAND gate 1105, an AND gate 1107, a D-latch circuit 1109 and two inverters 1106 and 118, connected as shown. The fourth read/write bank selection signal generating circuit shown in FIG. 9D for generating the bank selection signal 227, includes a NAND gate 1113, an AND gate 1115, a D-latch circuit 1116 and an inverter 1114, connected as shown.

In the prior art example shown in FIGS. 9A, 9B, 9C and 9D, the bank switching signal 248 for switching the bank number between two bank and four banks, is set to the logical high level. As mentioned above, the internal bank selection signals 208 and 209 are at the logical low level, and the bank activation signal 220 is at the logical high level. Therefore, in the first read/write bank selection signal generating circuit shown in FIG. 9A for the bank 700, an output of the AND gate 1102 is brought to the logical high level. On the other hand, in the third read/write bank selection signal generating circuit shown in FIG. 9C for the bank 702, although the bank activation signal 222 is at the logical high level, since an output of the NAND gate 1105 is at the logical low level, an output of the AND gate 1107 is at the logical low level. In the second and fourth read/write bank selection signal generating circuit shown in FIGS. 9B and 9D for the banks 701 and 703, at this time, an output of the AND gates 1111 and 1115 are at the logical low level, respectively. The output of these AND gates 1102, 1007, 1111 and 1115 are latched in the D-latches 1103, 1109, 1112 and 1116, respectively, in response to the internal read/write command signal 207, so that the read/write bank selection signal 224 of the logical high level and the read/write bank selection signals 225, 226 and 227 of the logical low level are outputted.

Furthermore, the address signal Ai, 244 supplied at the same time as the supplying of the read command, is latched in the clocked buffer circuit 216 in response to the internal clock signal 230, and further is latched in the D-latch 502 in response to the internal read/write command signal 207, so that the internal column address signal Yi, 246 is supplied to the memory cell array 101. At the timing T6 in the timing chart of FIG. 5, the column address value of the internal column address signal Yi, 246 corresponding to the address signal Ai, 244 is shown as a "COL1".

As shown in the bank structure diagram of FIG. 2, the read/write bank selection signal 224 and the internal column address signals Yi, 246 are supplied to the bank 700. As shown in the bank internal construction diagram of FIG. 3, the read/write bank selection signal 224 is supplied to the column switch driver 813 included in the column decode circuit 812. The internal column address signals Yi, 246 are also supplied to the column switch driver 813. If the read/write bank selection signal 224 is brought to the logical high level, the column switch driver 813 is activated, so that a signal (the output of the column switch driver 813) supplied to the column switch 814 selected by the column address value "COL1" is brought to the logical high level, with the result that the MOS transistors 815 and 817 acting as the reading switch are turned on. Therefore, data on the digit lines 809 and 810 are transferred through the MOS transistors 816 and 818 to the reading bus lines 819 and 820, respectively. The data amplifier circuit 821 is activated by the read/write bank selection signal 224 of the logical high level, so that the data on the reading bus lines 819 and 820 is amplified by the data amplifier circuit 821 and outputted through the input/output data line 704 to the external.

At a timing T7 in the timing chart of FIG. 5, the read command is supplied again, and the bank selection signals 200 and 201 are brought to the logical low level and the logical high level, respectively, so that the reading operation for another bank 702 is newly executed. The external active command signals including the $\overline{\text{RAS}}$ command signal 240, the $\overline{\text{CAS}}$ command signal 241, the WE command signal 242 and the CS command signal 243, are supplied through the buffer circuits 212, 213, 214 and 215 to the command decode circuit 204, and decoded by the command decode circuit 204 to bring the internal read/write command signal 207 to the logical high level, again. Since the bank selection signals 200 and 201 are at the logical low level and at the logical high level, respectively, as mentioned above, the internal bank selection signals 208 and 209 outputted from the buffer circuits 210 and 211 are brought to the logical low level and the logical high level, respectively.

The internal read/write command signal 207 and the internal bank selection signals 208 and 209 are supplied to the read/write bank selection signal generating circuitry 901. In the third read/write bank selection signal generating circuit shown in FIG. 9C for the bank 702, since as mentioned above the internal bank selection signals 208 and 209 are at the logical low level and at the logical high level, respectively, and since the bank activation signal 222 is at the logical high level, the output of the AND gate 1107 is at the logical high level. On the other hand, in the first read/write bank selection signal generating circuit shown in FIG. 9A for the bank 700, although the bank activation signal 220 is at the logical high level, since the internal bank selection signal 209 is at the logical high level, the output of the AND gate 1102 is brought to the logical low level. In the second and fourth read/write bank selection signal generating circuit shown in FIGS. 9B and 9D for the banks 701 and 703, at this time, an output of the AND gates 1111 and 1115 are at the logical low level, respectively. The output of these AND gates 1102, 1007, 1111 and 1115 are latched in the D-latches 1103, 1109, 1112 and 1116, respectively, in response to the internal read/write command signal 207, so that the read/write bank selection signal 226 of the logical high level is outputted from the third read/write bank selection signal generating circuit for the bank 702, and and the read/write bank selection signals 224, 225 and 227 for the banks 700, 701 and 703 are maintained at the logical low level. At the same time, since the column address value "COL2" is supplied as the internal column address signals Yi, 246, data at the column address in the bank 702 and designated by the column address value "COL2" is read out in response to the read/write bank selection signal 226 of the logical high level.

What is labelled with "PRE" at a timing T10 in the timing chart of FIG. 5, is a precharge command, and is determined by a specific logical value combination of the $\overline{\text{RAS}}$ command signal 240, the $\overline{\text{CAS}}$ command signal 241, the $\overline{\text{WE}}$ command signal 242 and the $\overline{\text{CS}}$ command signal 243, similarly to the other commands. This precharge command "PRE" corresponds to a rising of the $\overline{\text{RAS}}$ command signal 240 in a conventional DRAM, and has a function of fetching the bank selection signals 200 and 201, resetting the activation signals of the bank selected by the bank selection signals, and precharging the memory cell array.

At a timing T10 shown in FIG. 5, the external active command signals including the $\overline{\text{RAS}}$ command signal 240, the $\overline{\text{CAS}}$ command signal 241, the $\overline{\text{WE}}$ command signal 242 and the $\overline{\text{CS}}$ command signal 243, are supplied through the buffer circuits 212, 213, 214 and 215 to the command decode circuit 204 and decoded by the command decode circuit 204 so that the internal precharge signal 206 is brought to the logical high level. Since the internal bank activation signals 220 and 222 is at the logical high level at the timing T10, the banks 700 and 702 are in the activated condition. Accordingly, the banks to be precharged are the banks 700 and 702.

At the timing T10, both the bank selection signals 200 and 201 are set at the logical low level, so as to select the bank 700. These bank selection signals 200 and 201 are supplied through the clocked buffer circuits 210 and 211 as the internal bank selection signals 208 and 209 to the bank activation signal generating circuitry 900. Accordingly, at the timing T10, the internal bank selection signals 208 and 209 are both brought to the logical low level, so as to become consistent with the input logical value of the bank selection signals 200 and 201.

In the bank activation signal generating circuitry 900 shown in FIG. 6A, 6B, 6C and 6D, if the internal precharge command signal 206 of the logical high level is supplied, since both the internal bank selection signals 208 and 209 are at the logical low level, the output of the AND gate 1001 in the first bank activation signal generating circuit shown in FIG. 6A for the bank 700, is brought to the logical high level, and the output of the NOR gate 1004 is brought to the logical low level. On the other hand, since the internal activation command signal 205 is at the logical low level, the output of the AND gate 1000 is at the logical low level, so that the output of the NOR gate 1002 is brought to the logical high level. Thus, the output of the inverter 1003 is brought to the logical low level, with the result that the bank activation signal 220 for the bank 700 is brought to the logical low level. If the output of the NOR gate 1002 is brought to the logical high level as mentioned above, the output of the NOR gate 1004 is maintained at the logical low level, and therefore, the bank activation signal 220 for the bank 700 is maintained at the logical low level, regardless of the output of the AND gate 1001.

At a rising of the clock of a timing T11, the external active command signals are supplied again through the buffer circuits 212, 213, 214 and 215 to the command decode circuit 204, and decoded by the command decode circuit 204, so that the internal precharge signal 206 is brought to the logical low level. As a result, in the first bank activation signal generating circuit shown in FIG. 6A for the bank 700, the output of the AND gate 1001 is brought to the logical low level. Furthermore, in the internal construction of the banks 700–703 shown in FIG. 3, since the bank activation signal 220 has been brought to the logical low level, the word line driver 806 is deactivated so as to bring the word line 807 to the logical low level. In addition, the sense amplifier circuit 811 is deactivated in response to the bank activation signal 220 of the logical low level, so that the digit lines 809 and 810 are precharged.

At a timing T12 in the timing chart of FIG. 5, the precharge command is supplied again, and the bank selection signals 200 and 201 are set to the logical low level and the logical high level, respectively, for the purpose of precharging the bank 702. In this case, the internal precharge command signal 206 outputted from the command decode circuit 204 is brought the logical high level, again, and in accordance with the logical level of the bank selection signals 200 and 201, the internal bank selection signals 208 and 209 are brought to the logical low level and the logical high level, respectively.

In the bank activation signal generating circuit shown in FIG. 6C for the bank 702, if the internal precharge command signal 206 is brought to the logical high level again, since both the internal bank selection signals 208 and 209 are at the logical low level and the logical high level, respectively, the output of the AND gate 1014 is brought to the logical high level, and the output of the NOR gate 1017 is brought to the logical low level. On the other hand, since the internal activation command signal 205 is at the logical low level, the output of the AND gate 1013 is at the logical low level, so that the output of the NOR gate 1015 is brought to the logical high level. Thus, the output of the inverter 1016 is brought to the logical low level, with the result that the bank activation signal 222 for the bank 700 is brought to the logical low level. If the output of the NOR gate 1015 is brought to the logical high level, the output of the NOR gate 1017 is maintained at the logical low level, and therefore, the bank activation signal 222 is maintained at the logical low level, regardless of the output of the AND gate 1014.

At a rising of the clock of a timing T13, the external active command signals are supplied again through the buffer circuits 212, 213, 214 and 215 to the command decode circuit 204 and decoded by the command decode circuit 204 so that the internal precharge signal 206 is brought to the logical low level. As a result, the output of the AND gate 1014 is brought to the logical low level. Accordingly, in the bank 702, the sense amplifier circuit is deactivated in response to the bank activation signal 222 of the logical low level, so that the digit lines are precharged.

In the above description, the reading operation in the 4-bank structure has been explained. As mentioned above, in the case that the synchronous DRAM operates in the 4-bank structure, various operations including the activation of the memory bank, the read/write operation and the precharge operation is performed for a bank selected in accordance with the logical value combination of the bank selection signals 200 and 202 corresponding to two bits which make it possible to select one from four banks.

Next, the reading operation in a 2-bank structure will be explained. In the 2-bank structure, of the four banks each including the memory cell array and the control circuit therefore, the banks 700 and 702 are combined to constitute the same bank, and similarly, the banks 701 and 703 are combined to constitute the same bank. In the following description of the reading operation in the 2-bank structure, therefore, the banks 700, 701, 702 and 703 will be temporarily called "groups" 700, 701, 702 and 703, respectively, and it is considered that a first bank is constituted of the groups 700 and 702, and a second bank is constituted of the groups 701 and 703. Further, the bank selection is performed by only the logical value of the bank selection signal 200. Here, when the bank selection signal 200 is at the logical low level, the first bank constituted of the groups 700 and 702 is selected, and when the bank selection signal 200 is at the logical high level, the second bank constituted of the groups 701 and 703 is selected. The bank selection signal 201 used as the bank selection signal in the 4-bank structure as mentioned above, is handled as the most significant bit of the row address signal, and is used as a selection address for partially operating the bank in the first bank (groups 700 and 702) or in the second bank (groups 701 and 703) in the memory cell array 101 when it is activated. In the following reading operation of the 2-bank structure, therefore, this bank selection signal 201 will be temporarily called an "address signal 201", and correspondingly, the internal bank selection signal 209 will be temporarily called an "internal address signal 209".

When the first bank is activated, if the address signal 201 is at the logical low level, the group 700 of the memory cell array 101 is activated, and if the address signal 201 is at the logical high level, the group 702 of the memory cell array 101 is activated. When the second bank is activated, if the address signal 201 is at the logical low level, the group 701 of the memory cell array 101 is activated, and if the address signal 201 is at the logical high level, the group 703 of the memory cell array 101 is activated. In the read/write operation and in the precharge operation, an invalid input value is supplied to the address signal 201.

Referring to FIG. 10, there is shown a timing chart illustrating an operation of the synchronous DRAM in the 2-bank structure. At a timing T1 in the timing chart of FIG. 10, an active external command is supplied, and simultaneously, the address signals Ai, 244, the address signal 201 of the logical low level and the bank selection signal 200 of the logical low level are fetched, so that in the first bank constituted of the groups 700 and 702, the group 700 within the memory cell array 101 is activated. Furthermore, in response to the bank selection signal 200 of the logical low level and the address signal 201 of the logical low level, the internal bank selection signal 208 and the internal address signal 209 are both brought to the logical low level.

In the bank activation signal generating circuitry 900 having the internal construction shown in FIGS. 6A, 6B, 6C and 6D, the bank switching signal 248 of the logical low level is supplied, and on the other hand, the internal precharge command signal 206 is at the logical low level. Furthermore, it is assumed that all the bank activation signals 220, 221, 222 and 223 are at the logical low level.

In this condition, if the internal activation command signal 205 is brought to the logical high level, since the internal bank selection signal 208 is at the logical low level and the internal address signal 209 is at the logical low level, in the first bank activation signal generating circuit shown in FIG. 6A, the output of the AND gate 1000 is brought to the logical high level, and the output of the NOR gate 1002 is brought to the logical low level, so that the output of the inverter 1003 is brought to the logical high level, with the result that the bank activation signal 220 is brought to the logical high level. On the other hand, since the internal precharge command signal 206 is at the logical low level, the output of the AND gate 1001 is at the logical low level. Since the output of the NOR gate 1002 is at the logical low level, the output of the NOR gate 1004 is brought to the logical high level. Therefore, the output of the NOR gate 1002 is maintained at the logical low level, regardless of the output level of the AND gate 1000. Thus, the bank activation signal 220 is maintained at the logical high level.

At a rising of the clock signal in a timing T2 shown in FIG. 10, the internal activation command signal 205 is brought to the logical low level. In the first bank activation signal generating circuit shown in FIG. 6A for the group 700, accordingly, the output of the AND gate 1000 is brought to the logical low level at this time.

At the timing T1 in the timing chart of FIG. 10, since the row address value "ROW1" is supplied as the address signals Ai, 244, this row address value "ROW1" is transferred by the corresponding internal row address signals Xi, 245. The internal bank activation signal 220 of the logical high level is supplied to the group 700 included in the first bank. Thus, the word line designated by the row address value "ROW1" is selected, so that data of a corresponding memory cell is amplified by the sense amplifier circuit.

Incidentally, at a timing T6 in the timing chart of FIG. 10, the external read command is inputted, and the bank selection signal 200 of the logical low level is inputted, so that the reading operation is executed for the first bank. In this condition, the internal bank selection signal 208 is at the logical low level in accordance with the logical level of the bank selection signal 200.

In the read/write bank selection signal generating circuitry 901 having the internal construction as shown in FIGS. 9A, 9B, 9C and 9D, the bank switching signal 248 is at the logical low level and the internal precharge command signal 206 at the logical low level. Therefore, the output of all the NAND gates 1101, 1105, 1110 and 1113 receiving the internal address signal 209 are brought to the logical high level. Accordingly, the logical value of the internal address signal 209 corresponding to the external address signal 201 is not fetched as an effective value and therefore do not give any influence to an internal operation. Furthermore, since the internal bank selection signal 208 is at the logical low level, the output of the inverters 1104 and 1108 shown in FIGS. 9A and 9C are both at the logical high level. In addition, in the circuit shown in FIG. 9A, since the internal bank activation signal 220 is at the logical high level, the output of the AND gate 1102 is brought to the logical high level. On the other hand, in the circuit shown in FIG. 9C, since the internal bank activation signal 222 is at the logical low level, the output of the AND gate 1107 is at the logical low level. The output of the other AND gates 1111 and 1115 are the logical low level, since the internal bank selection signal 208 is at the logical low level.

The output of the AND gates 1102, 1107, 1111 and 1115 are latched in the D-latch circuits 1103, 1109, 1112 and 1116, respectively, in response to the internal read/write command signal 207. Thus, the internal read/write bank selection signal 224 of the logical high level and the internal read/write bank selection signals 226, 225 and 227 of the logical low level are outputted. In this situation, the column address value "COL1" of the internal column address signals Yi, 246 are simultaneously supplied as the address signals. Thus, in the group 700 of the first bank supplied with the internal read/write bank selection signal 224 of the logical high level, data is read out from the column address designated by the column address value "COL1".

At a timing T10 shown in FIG. 10, the external precharge command is inputted, and the bank selection signal 200 is brought to the logical low level for the purpose of precharging the first bank. The internal precharge command signal 206 is brought to the logical high level, and the internal bank selection signal 208 is brought to the logical low level in accordance with the logical value of the bank selection signal 200.

In the bank activation signal generating circuitry 900 having the internal construction shown in FIG. 6A, 6B, 6C and 6D, the bank switching signal 248 is at the logical low level, and the internal precharge command signal 206 is at the logical high level. Therefore, the output of all the NAND gates 1101, 1105, 1110 and 1113 receiving the internal address signal 209 are brought to the logical high level. Accordingly, the logical value of the internal address signal 209 corresponding to the external address signal 201 is not fetched as an effective value and therefore do not give any influence to an internal operation. Furthermore, since the internal bank selection signal 208 is at the logical low level, the output of the inverters 1005 and 1018 shown in FIGS. 6A and 6C are at the logical high level. However, in the first bank activation signal generating circuit shown in FIG. 6A, the output of the AND gate 1001 is brought to the logical high level since the bank activation signal 220 is at the logical high level and the internal precharge command signal 206 is at the logical high level, so that the output of the NOR gate 1004 is brought to the logical low level. On the other hand, in the third bank activation signal generating circuit shown in FIG. 6C, since the bank activation signal 222 is at the logical low level, the output of the AND gate 1014 is at the logical low level. An output of the other AND gates 1008 and 1020 remain at the logical low level, even if the internal precharge command signal 206 is brought to the logical high level.

In the first bank activation signal generating circuit shown in FIG. 6A, since the internal activation command signal 205 is at the logical low level, the output of the AND gate 1000 is at the logical low level. Thus, the output of the NOR gate 1002 is brought to the logical high level, so that the output of the inverter 1003 is brought to the logical low level, with the result that the bank activation signal 220 is brought to the logical low level. If the output of the NOR gate 1002 is brought to the logical high level as mentioned above, the output of the NOR gate 1004 is maintained at the logical low level, and therefore, the bank activation signal 220 is maintained at the logical low level, regardless of the output of the AND gate 1001.

At a rising of the clock of a timing T11 in FIG. 10, the internal precharge command signal 206 is brought to the logical low level. Accordingly, in the first bank activation signal generating circuit shown in FIG. 6A for the group 700 of the first bank, the output of the AND gate 1001 is brought to the logical low level. Furthermore, since the bank activation signal 220 has been brought to the logical low level, the word line driver 806 is deactivated so as to bring the word line 807 to the logical low level. In addition, the sense amplifier circuit 811 is deactivated in response to the bank activation signal 220 of the logical low level, so that the digit lines 809 and 810 are precharged.

Thus, the 2-bank structure operation has been described. In the case of the 2-bank structure operation, the activation of the memory bank, the read/write operation and the precharge operation are executed for the bank selected by the input logical value of only bank selection signal 200.

As mentioned above, when the prior art synchronous DRAM operates in the 4-bank structure, the read/write operation and the precharge operation are executed for one bank selected from the four banks by the input logical value of the bank selection signal of two bits (200 and 201). When the prior art synchronous DRAM operates in the 2-bank structure, the read/write operation and the precharge operation are executed for an activated group of the memory cell array, within one bank selected from the two banks by the input logical value of only bank selection signal 200. In this case, in the read/write operation and the precharge operation performed in the 2-bank structure, it is necessary to set the bank switching signal to the logical low level so as to invalidate the signal which is handled as the bank selection signal (201) in the 4-bank structure operation. However, this bank switching signal is fixed to either the logical high level or the logical low level in the product manufacturing process, so that the semiconductor memory manufactured as the synchronous DRAM is shipped with being classified into either the 2-bank structure semiconductor memory or the 4-bank structure semiconductor memory.

In a practical use, therefore, it is impossible to change the prior art synchronous DRAM from the 2-bank structure to the 4-bank structure and vice versa.

SUMMARY OF THE INVENTION

Accordingly, it is an object of the present invention to provide a synchronous DRAM which has overcome the above mentioned defect of the conventional one.

Another object of the present invention is to provide a synchronous DRAM capable of changing from the 2-bank structure to the 4-bank structure and vice versa.

The above and other objects of the present invention are achieved in accordance with the present invention by a synchronous readable and writable semiconductor memory comprising:

a memory cell array constituted of a plurality of memory banks;

a bank control signal generating means receiving external active command signals including a row address strobe command signal, a column address strobe command signal, a write enable command signal and a chip select command signal, and external bank selection signals for selectively designating the plurality of memory banks, the bank control signal generating means generating a plurality of read/write bank selection signals and a plurality of bank activation signals for selectively operating the memory banks, to the memory cell array, the bank control signal generating means also generating an internal activation command signal and an internal read/write command signal; and an address signal generating means receiving external address signals and the internal command signal and the internal read/write command signal, for outputting an internal row address signal and an internal column address signal for a memory bank to be selected, to the memory cell array, the bank control signal generating means being configured to selectively operate at least one memory bank in at least a data read/write operation without receiving an external bank switching signal having a function of switching the number of memory banks.

In an embodiment of the synchronous readable and writable semiconductor memory in accordance with the present invention, the bank control signal generating means includes:

a first buffer circuit fetching the external active command signals in response to an internal clock signal, for outputting the external active command signals as internal command signals;

a command decode circuit receiving the internal command signals, for generating an internal precharge command signal, the internal activation command signal and the internal read/write command signal;

a second buffer circuit fetching the external bank selection signals in response to the internal clock signal, for outputting the external bank selection signals as internal bank selection signals;

a bank activation signal generating circuitry receiving the internal bank selection signals, the internal activation command signal and the internal precharge command signal, for generating bank activation signals for the memory banks, respectively; and a read/write bank selection signal generating circuitry receiving the internal bank selection signals, the internal read/write command signal and the bank activation signals, for generating read/write bank selection signals for the memory banks, respectively.

In a specific embodiment, the memory cell array is constituted of first, second, third and fourth memory banks, and the second buffer circuit outputs first and second internal bank selection signals. Further, the bank activation signal generating circuitry receiving the first and second internal bank selection signals, the internal activation command signal and the internal precharge command signal, the bank activation signal generating circuitry including first, second, third and fourth bank activation signal generating circuits for generating first, second, third and fourth bank activation signals for the first, second, third and fourth memory banks, respectively. In addition, the read/write bank selection signal generating circuitry receiving the first and second internal bank selection signals, the internal read/write command signal and the first, second, third and fourth bank activation signals, the read/write bank selection signal generating circuitry including first, second, third and fourth read/write bank selection signal generating circuits for generating first, second, third and fourth read/write bank selection signals for the first, second, third and fourth memory banks, respectively.

The above and other objects, features and advantages of the present invention will be apparent from the following description of preferred embodiments of the invention with reference to the accompanying drawings.

DESCRIPTION OF THE PREFERRED EMBODIMENT

Figure 1:
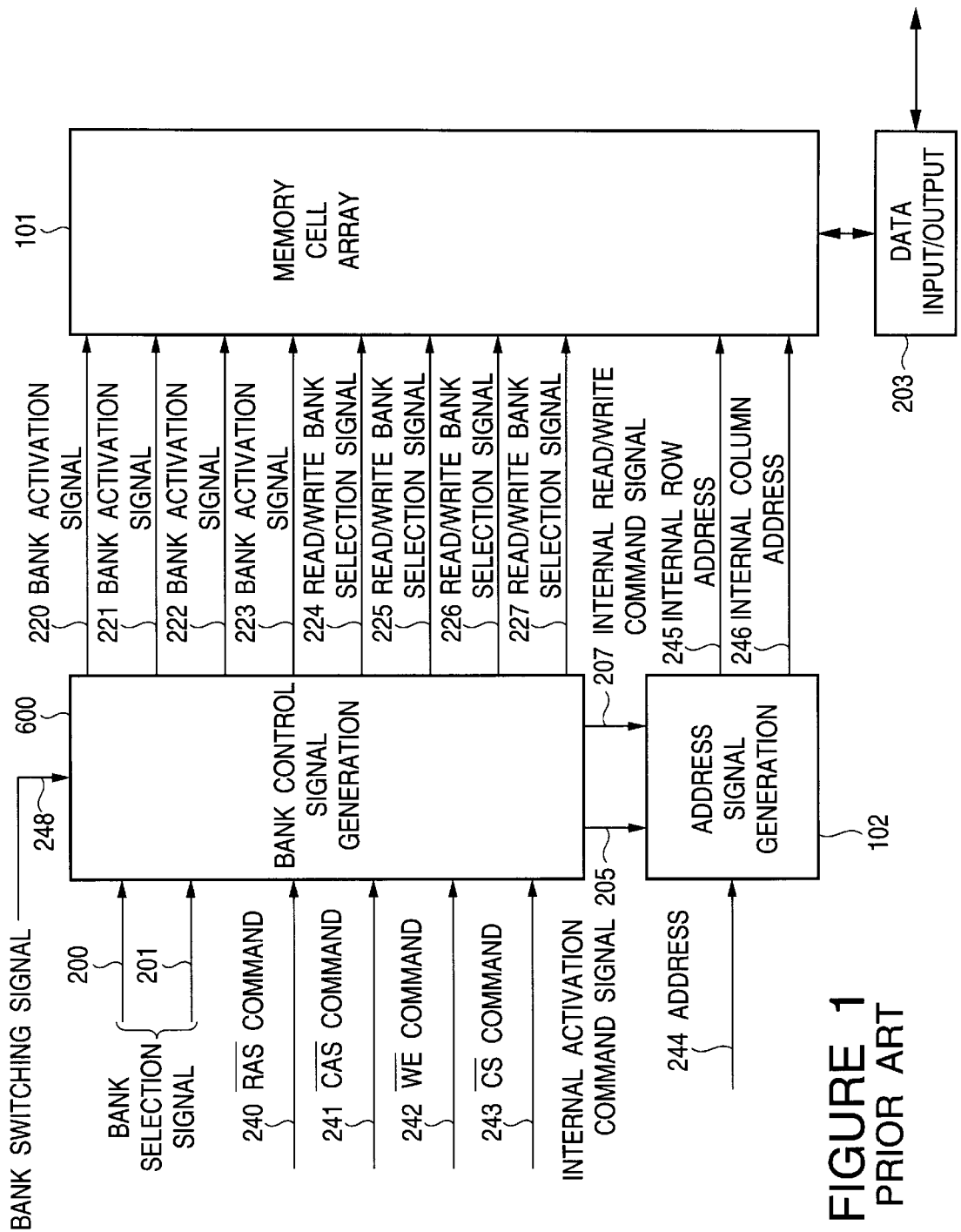
FIG. 1 is a block diagram of the prior art example of the synchronous DRAM.

Now, an embodiment of the synchronous DRAM in accordance with the present invention will be described with reference to the drawings. In the following description of an operation of the embodiment, similarly to that for the prior art example, a data reading operation will be described as an example of the 2-bank structure operation and the 4-bank structure operation. In addition, in the following drawings, elements corresponding to those shown in FIGS. 1 to 10 are given the same Reference Numerals.

Figure 11:
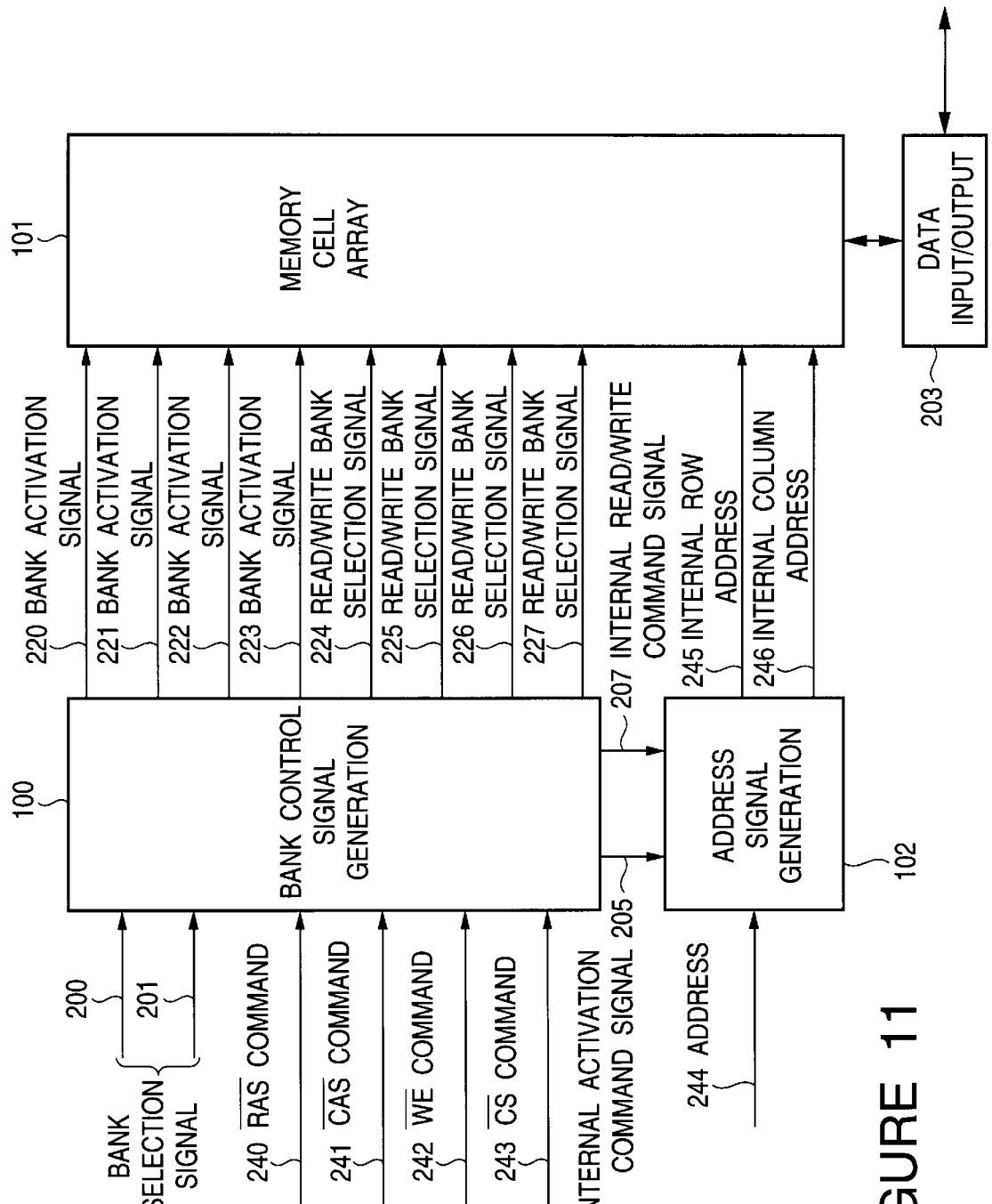
FIG. 11 is a block diagram of an embodiment of the synchronous DRAM in accordance with the present invention.

Referring to FIG. 11, there is shown a block diagram of an embodiment of the synchronous DRAM in accordance with the present invention, which can operate selectively either in the 2-bank structure or in the 4-bank structure, but which is constructed in the form of the 4-bank structure. As shown in FIG. 11, the embodiment of the synchronous DRAM includes a bank control signal generating unit 100 receiving a pair of bank selection signals 200 and 201 and active command signals including a $\overline{RAS}$ command signal 240, a $\overline{CAS}$ command signal 241, a $\overline{WE}$ command signal 242 and a $\overline{CS}$ command signal 243, and for generating an internal activation command signal 205, an internal read/write command signal 207, bank activation signals 220, 221, 222 and 223 and read/write bank selection signals 224, 225, 226 and 227. The shown synchronous DRAM also includes an address signal generating unit 102 receiving address signals Ai, 244 and for generating internal row address signals Xi, 245 and internal column address signals Yi, 246, a memory cell array 101 divided into a plurality of banks, and receiving the signals outputted from the bank control signal generating unit 100 and the address signal generating unit 102, for supplying and receiving a read/write data, and a data input/output unit 103 coupled to the memory cell array 101.

As seen from comparison between FIGS. 1 and 11, in the prior art example shown in FIG. 1, the bank switching signal 248 for switching between the 2-bank structure and the 4-bank structure, is supplied to the bank control signal generating unit 600, but in the shown embodiment of the present invention, this bank switching signal 248 is not supplied to the bank control signal generating unit 100. Namely, the present invention no longer requires the bank switching signal which was required in the prior art example, and this is a large feature of the present invention.

Figure 12:
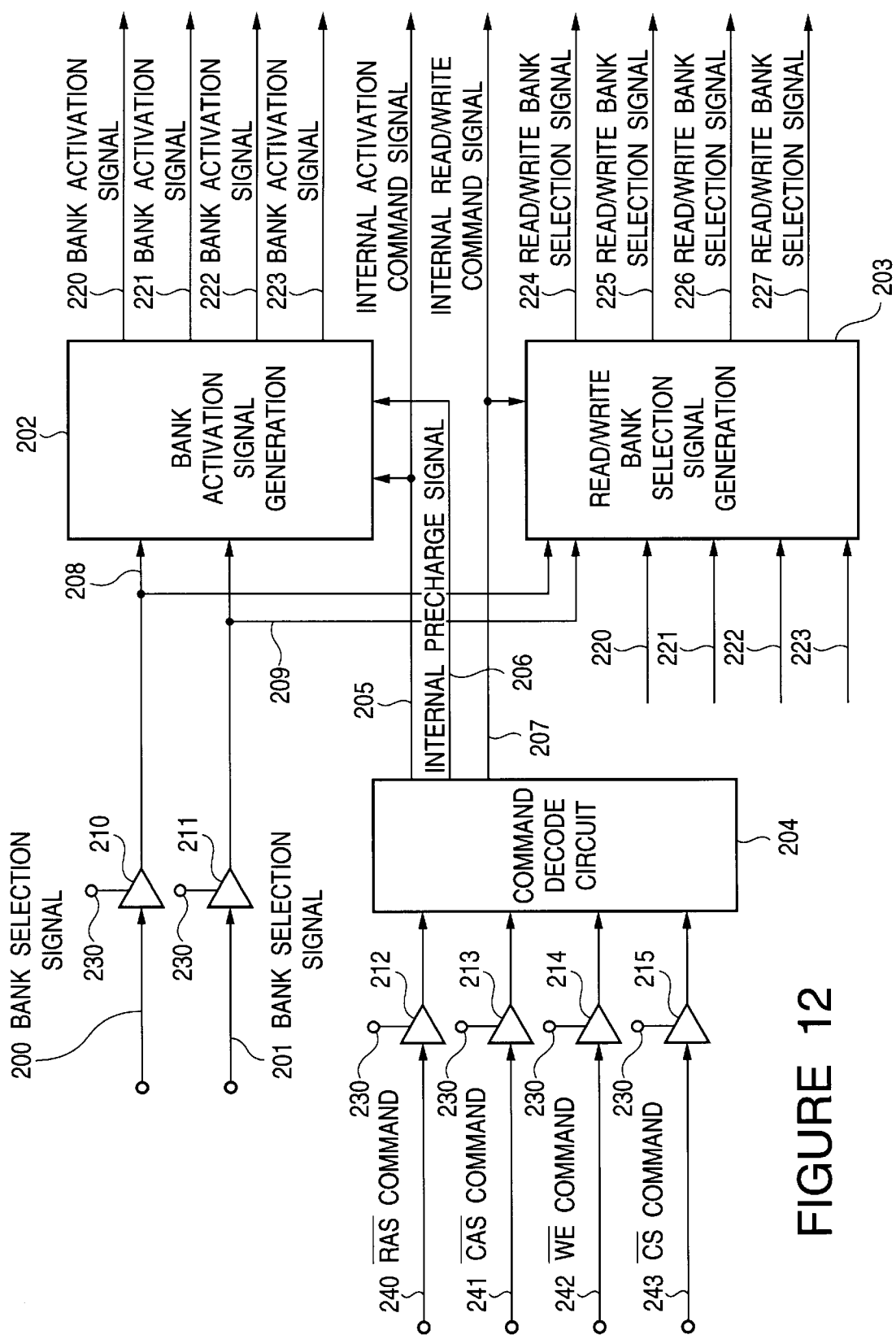
FIG. 12 is a block diagram illustrating an internal construction of the bank control signal generating unit shown in FIG. 11.

Referring to FIG. 12, there is shown a block diagram illustrating an internal construction of the bank control signal generating unit shown in FIG. 11.

Similarly to the bank control signal generating unit 600, the shown bank control signal generating unit 100 includes clocked buffer circuits 212, 213, 214 and 215 receiving the $\overline{RAS}$ command signal 240, the $\overline{CAS}$ command signal 241, the $\overline{WE}$ command signal 242 and the $\overline{CS}$ command signal 243, respectively, and controlled in common by an internal clock signal 230, a command decode circuit 204 receiving an output of the clocked buffer circuits 212, 213, 214 and 215, for generating the internal activation command signal 205, an internal precharge signal 206 and the internal read/write command signal 207, and clocked buffer circuits 210 and 211 receiving the bank selection signals 200 and 201, respectively and controlled in common by the internal clock signal 230 for generating internal bank selection signals 208 and 209, respectively.

The shown bank control signal generating unit 100 also includes a bank activation signal generating circuitry 202 receiving the internal bank selection signals 208 and 209, the internal activation command signal 205, and the internal precharge signal 206, for generating the bank activation signals 220, 221, 222 and 223 for four banks, respectively, and a read/write bank selection signal generating circuitry 203 receiving the bank activation signals 220, 221, 222 and 223, the internal bank selection signals 208 and 209, and the internal read/write command signal 207, for generating the read/write bank selection signals 224, 225, 226 and 227 for the four banks, respectively.

Figure 7:
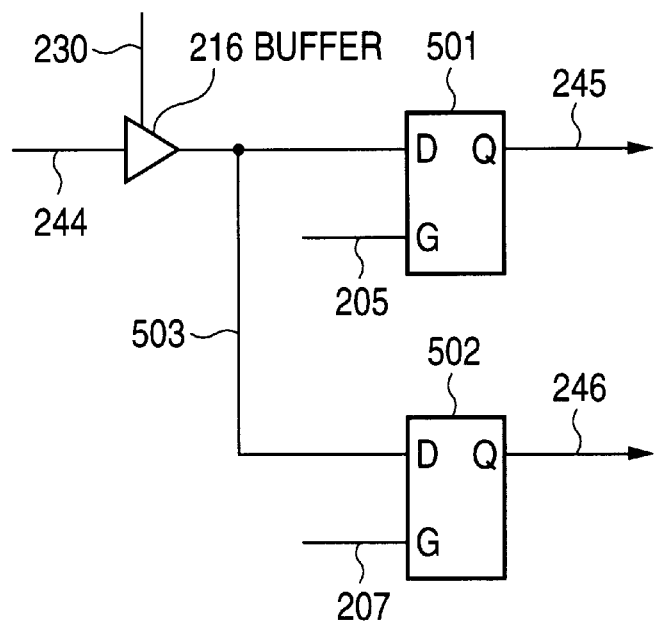
FIG. 7 is a logic circuit diagram illustrating an internal construction of the address signal generating unit shown in FIG. 1.
Figure 8:
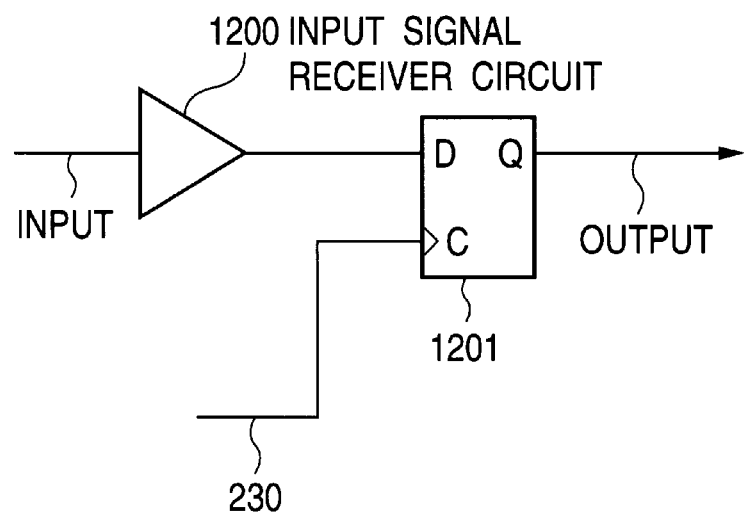
FIG. 8 is a logic circuit diagram illustrating an internal construction of each of the clocked buffer circuits shown in FIGS. 4 and 7.
Figure 9A:
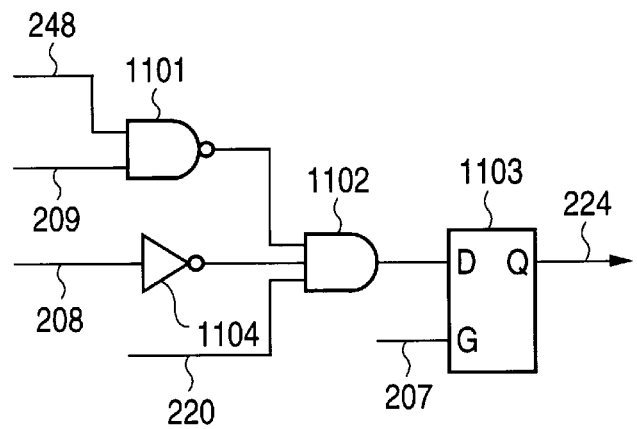
FIGS. 9A, 9B, 9C and 9D are logic circuit diagrams illustrating an internal construction of the read/write bank selection signal generating circuitry shown in FIG. 4.
Figure 9B:
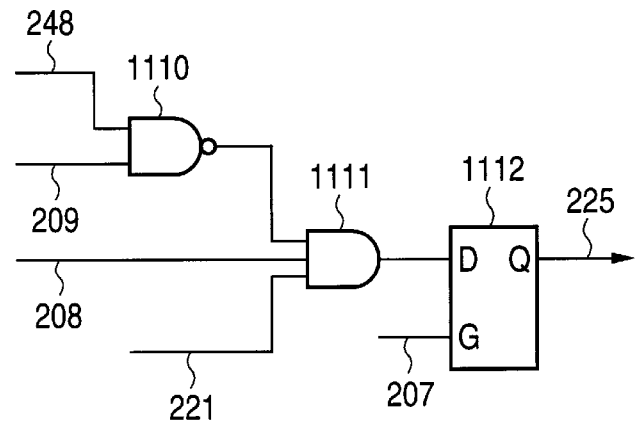
Figure 9C:
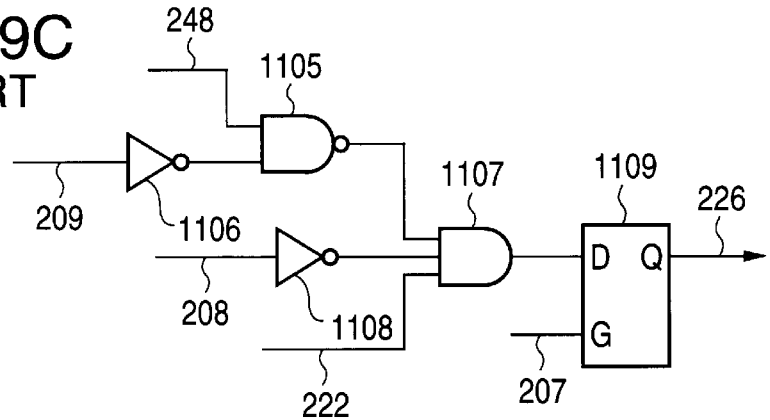
Figure 9D:
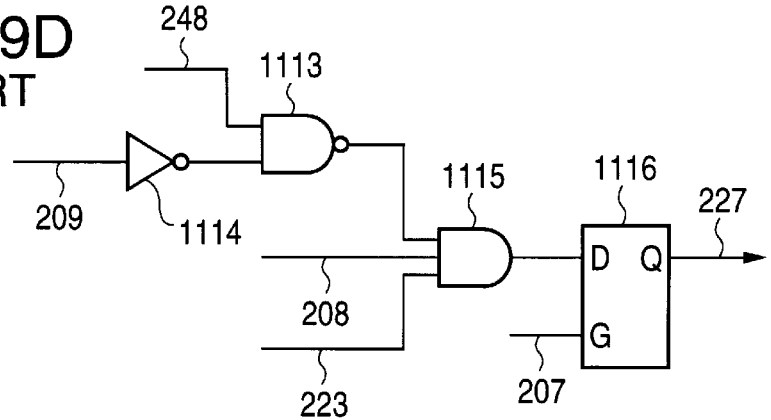

Similarly to the prior art example shown in FIG. 1, the address signal generating unit 102 has an internal construction as shown in FIG. 7. Since the internal construction of the address signal generating unit 102 shown in FIG. 7 has been already described, a further description will be omitted.

Referring to FIGS. 13A, 13B, 13C and 13D, there are shown logic circuit diagrams illustrating an internal construction of the bank activation signal generating circuitry 202 shown in FIG. 12, which is constituted to be able to operate in the 4-bank structure.

Figure 2:
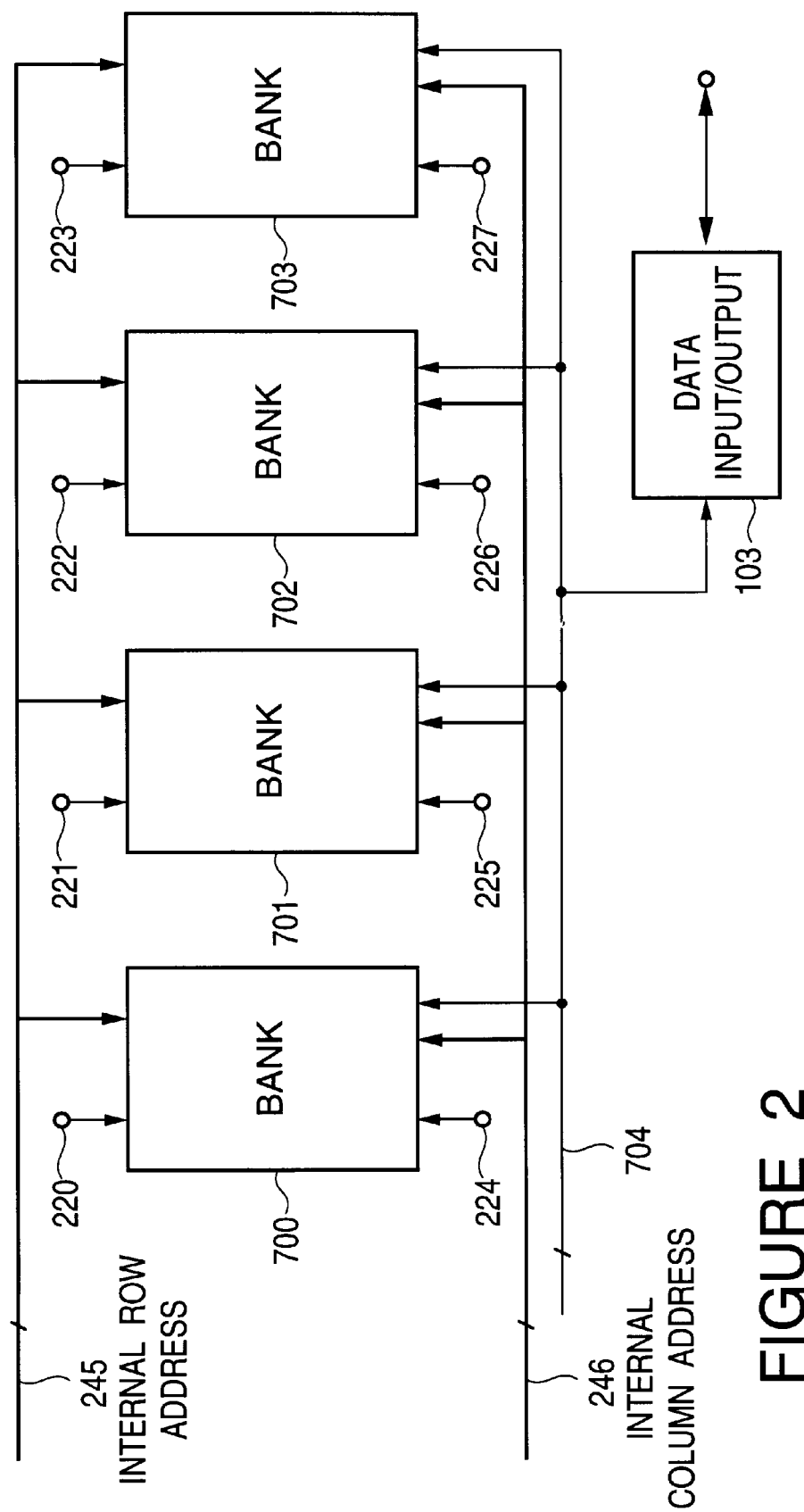
FIG. 2 is a block diagram illustrating the bank structure of the memory cell array included in the synchronous DRAM shown in FIG. 1.
Figure 3:
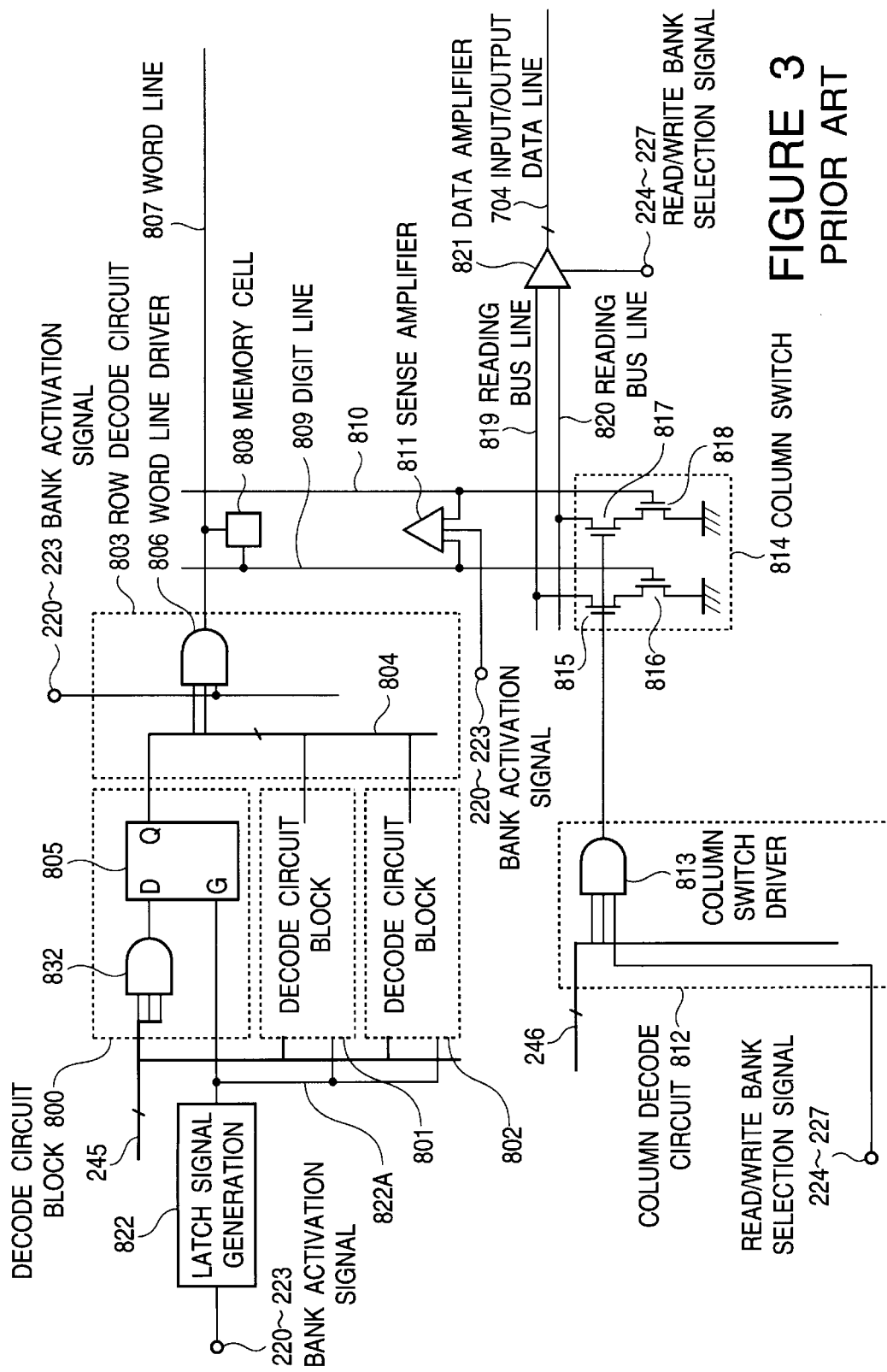
FIG. 3 is a block diagram illustrating a portion of an internal construction of each of the banks shown in FIG. 2.
Figure 4:
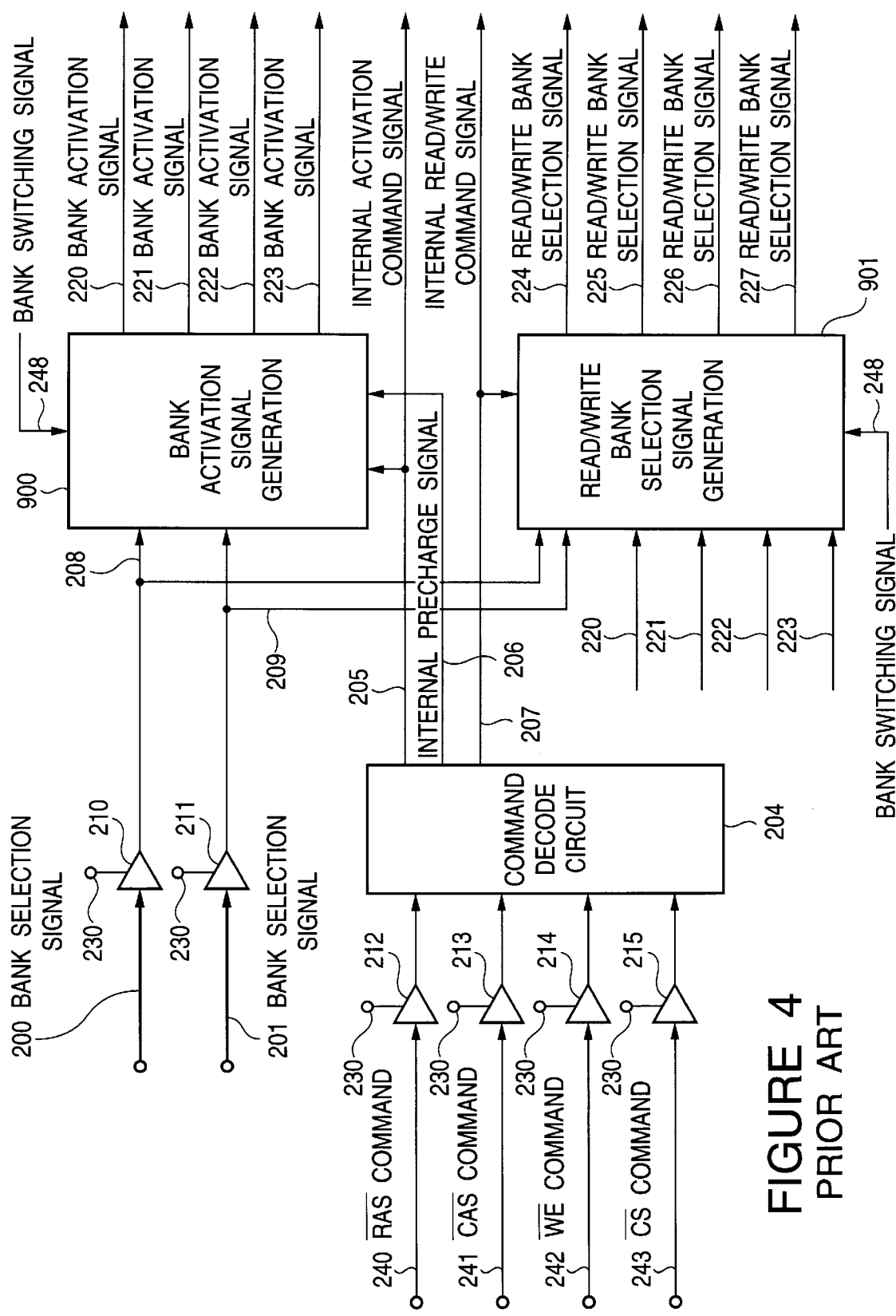
FIG. 4 is a block diagram illustrating an internal construction of the bank control signal generating unit shown in FIG. 1.

The bank activation signal generating circuitry 202 includes four, namely, first, second, third and fourth bank activation signal generating circuits shown in FIGS. 13A, 13B, 13C and 13D, respectively, for generating the bank activation signals 220, 221, 222 and 223 for the banks 700, 701, 702 and 703 shown in FIG. 2, respectively.

Figure 13A:
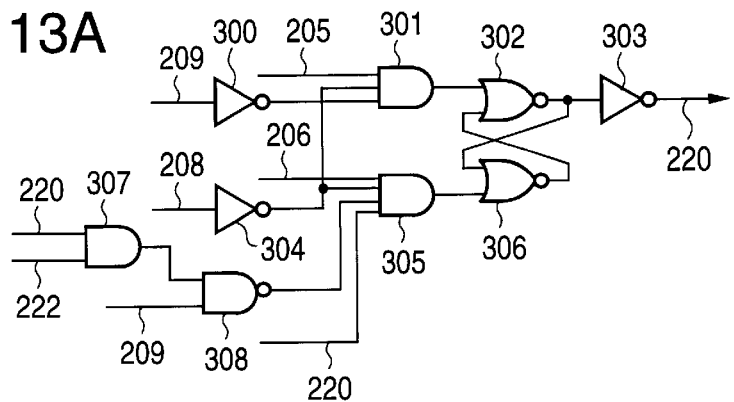
FIGS. 13A, 13B, 13C and 13D are logic circuit diagrams illustrating an internal construction of the bank activation signal generating circuitry shown in FIG. 12.

The first bank activation signal generating circuit shown in FIG. 13A for generating the bank activation signal 220, includes a first AND gate 307 receiving the first bank activation signal 220 and the third bank activation signal 222, a first NAND gate 308 receiving an output of the AND gate 307 and the second internal bank selection signal 209, a first inverter 304 receiving the first internal bank selection signal 208, a second inverter 300 receiving the second internal bank selection signal 209, a second AND gate 301 receiving the internal activation command signal 205, an output of the first inverter 304 and an output of the second inverter 300, a third AND gate 305 receiving the internal precharge command signal 206, the output of the first inverter 304, an output of the first NAND gate 308 and the first bank activation signal 220, a first NOR gate 302 having a first input connected to an output of the second AND gate 301, a second NOR gate 306 having a first input connected to an output of the third AND gate 305 and a second input connected to an output of the first NOR gate 302, an output of the second NOR gate 306 being connected to a second input of the first NOR gate 302, and a third inverter 303 receiving the output of the first NOR gate 302, an output of the third inverter 303 outputting the first bank activation signal 220. With this construction, the NOR gates 302 and 306 constitute a R-S flipflop.

Figure 13B:
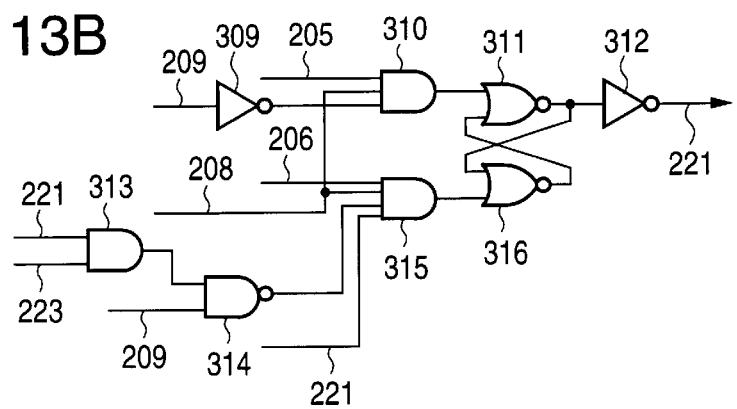

The second bank activation signal generating circuit shown in FIG. 13B for generating the bank activation signal 221, includes a fourth AND gate 313 receiving the second bank activation signal 221 and the fourth bank activation signal 223, a second NAND gate 314 receiving an output of the fourth AND gate 313 and the second internal bank selection signal 209, a fourth inverter 309 receiving the second internal bank selection signal 209, a fifth AND gate 310 receiving the internal activation command signal 205, an output of the fourth inverter 309 and the first internal bank selection signal 208, a sixth AND gate 315 receiving the internal precharge command signal 206, the first internal bank selection signal 208, an output of the second NAND gate 314 and the second bank activation signal 221, a third NOR gate 311 having a first input connected to an output of the fifth AND gate 310, a fourth NOR gate 316 having a first input connected to an output of the sixth AND gate 315 and a second input connected to an output of the third NOR gate 311, an output of the fourth NOR gate 316 being connected to a second input of the third NOR gate 311, and a fifth inverter 312 receiving the output of the third NOR gate 311, an output of the fifth inverter 312 outputting the second bank activation signal 221. With this construction, the NOR gates 311 and 33166 constitute a R-S flipflop.

Figure 13C:
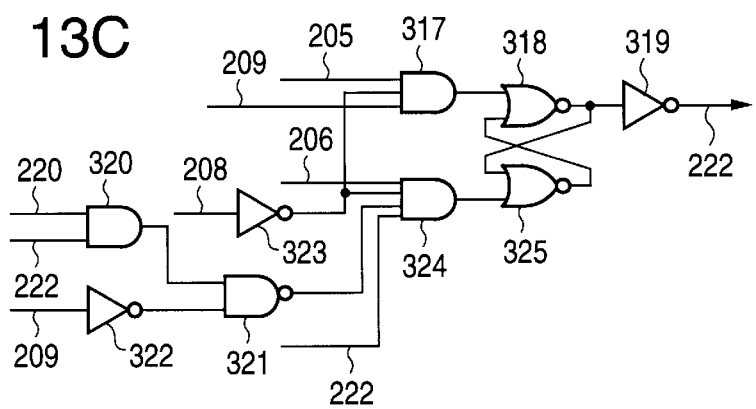

The third bank activation signal generating circuit shown in FIG. 13C for generating the bank activation signal 222, includes a seventh AND gate 320 receiving the first bank activation signal 220 and the third bank activation signal 222, a sixth inverter 322 receiving the second internal bank selection signal 209, a third NAND gate 321 receiving an output of the seventh AND gate 320 and an output of the sixth inverter 322, a seventh inverter 323 receiving the first internal bank selection signal 208, an eighth AND gate 317 receiving the internal activation command signal 205, the second internal bank selection signal 209 and an output of the seventh inverter 323, a ninth AND gate 324 receiving the internal precharge command signal 205, the output of the seventh inverter 323, an output of the third NAND gate 321 and the third bank activation signal 222, a fifth NOR gate 318 having a first input connected to an output of the eighth AND gate 317, a sixth NOR gate 325 having a first input connected to an output of the ninth AND gate 324 and a second input connected to an output of the fifth NOR gate 318, an output of the sixth NOR gate 325 being connected to a second input of the fifth NOR gate 318, and an eighth inverter 319 receiving the output of the fifth NOR gate 318, an output of the eighth inverter 319 outputting the third bank activation signal 222. With this construction, the NOR gates 318 and 325 constitute a R-S flipflop.

Figure 13D:
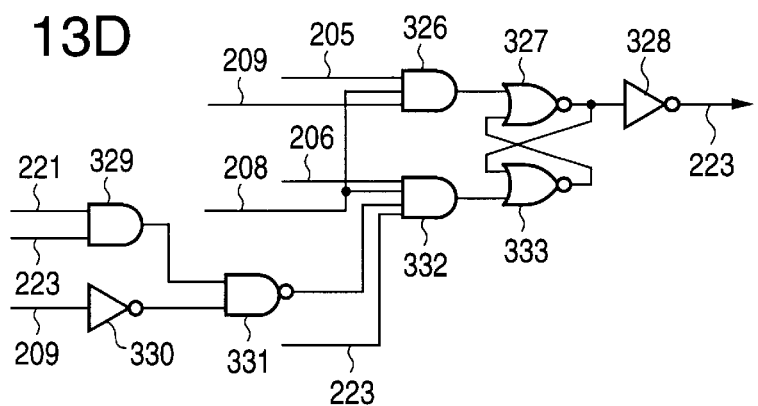

The fourth bank activation signal generating circuit shown in FIG. 13D for generating the bank activation signal 223, includes a tenth AND gate 329 receiving the second bank activation signal 221 and the fourth bank activation signal 223, a ninth inverter 330 receiving the second internal bank selection signal 209, a fourth NAND gate 331 receiving an output of the tenth AND gate 329 and an output of the ninth inverter 330, an eleventh AND gate 326 receiving the internal activation command signal 205, the first internal bank selection signal 208 and the second internal bank selection signal 209, a twelfth AND gate 332 receiving the internal precharge command signal 206, the first internal bank selection signal 20fourth bank of the fourth NAND gate 331 and the fourth bank activation signal 223, a seventh NOR gate 327 having a first input connected to an output of the eleventh AND gate 326, an eighth NOR gate 333 having a first input connected to an output of the twelfth AND gate 332 and a second input connected to an output of the eleventh NOR gate 327, an output of the twelfth NOR gate 333 being connected to a second input of the eleventh NOR gate 327, and a ninth inverter 328 receiving the output of the eleventh NOR gate 327, an output of the ninth inverter 328 outputting the fourth bank activation signal 223. With this construction, the NOR gates 327 and 333 constitute a R-S flipflop.

Referring to FIGS. 14A, 14B, 14C and 14D, there are shown logic circuit diagrams illustrating an internal construction of the read/write bank selection signal generating circuitry 203 shown in FIG. 12, which is constituted to be able to operate in the 4-bank structure, similarly to the bank activation signal generating circuitry 202.

The read/write bank selection signal generating circuitry 203 includes first, second, third and fourth read/write bank selection signal generating circuits shown in FIGS. 14A, 14B, 14C and 14D, respectively, for generating the read/write bank selection signals 224, 225, 226 and 227 for the banks 700, 701, 702 and 703, respectively.

Figure 14A:
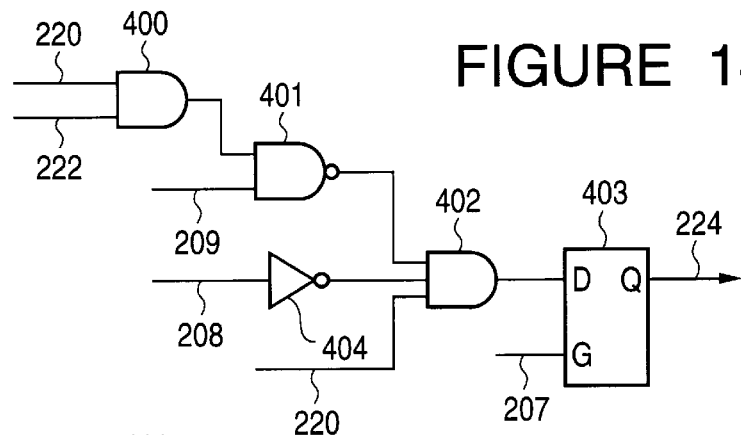
FIGS. 14A, 14B, 14C and 14D are logic circuit diagrams illustrating an internal construction of the read/write bank selection signal generating circuitry shown in FIG. 12.

The first read/write bank selection signal generating circuit shown in FIG. 14A for generating the bank selection signal 224, includes a thirteenth AND gate 400 receiving the first bank activation signal 220 and the third bank activation signal 222, a fifth NAND gate 401 receiving the second internal bank selection signal 209 and an output of the thirteenth AND gate 400, a tenth inverter 404 receiving the first internal bank selection signal 208, a fourteenth AND gate 402 receiving an output of the fifth NAND gate 401, an output of the tenth inverter 404 and the first bank activation signal 220, and a first D-latch circuit 403 latching an output of the fourteenth AND gate 402 in response to the internal read/write command signal 207, for outputting the first read/write bank selection signal 224.

Figure 14B:
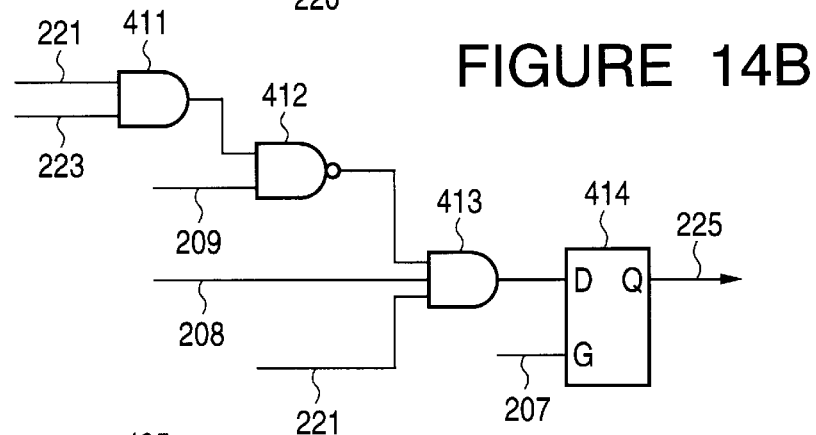

The second read/write bank selection signal generating circuit shown in FIG. 14B for generating the bank selection signal 225, includes a fifteenth AND gate 411 receiving the second bank activation signal 221 and the fourth bank activation signal 223, a sixth NAND gate 412 receiving the second internal bank selection signal 209 and an output of the fifteenth AND gate 411, a sixteenth AND gate 413 receiving the first internal bank selection signal 208, an output of the sixth NAND gate 412 and the second bank activation signal 221, and a second D-latch circuit 414 latching an output of the sixteenth AND gate 413 in response to the internal read/write command signal 207, for outputting the second read/write bank selection signal 225.

Figure 14C:
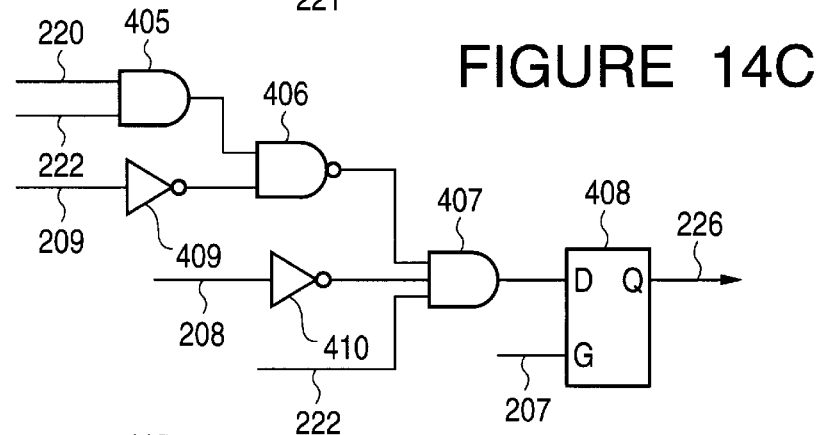

The third read/write bank selection signal generating circuit shown in FIG. 14C for generating the bank selection signal 226, includes a seventeenth AND gate 405 receiving the first bank activation signal 220 and the third bank activation signal 222, an eleventh inverter 409 receiving the second internal bank selection signal, a seventh NAND gate 406 receiving an output of the seventeenth AND gate 405 and an output of the eleventh inverter 409, a twelfth inverter 410 receiving the first internal bank selection signal 208, an eighteenth AND gate 407 receiving an output of the seventh NAND gate 406, an output of the twelfth inverter 410 and the third bank activation signal 222, and a third D-latch circuit 408 latching an output of the eighteenth AND gate 407 in response to the internal read/write command signal 207, for outputting the third read/write bank selection signal 226.

Figure 14D:
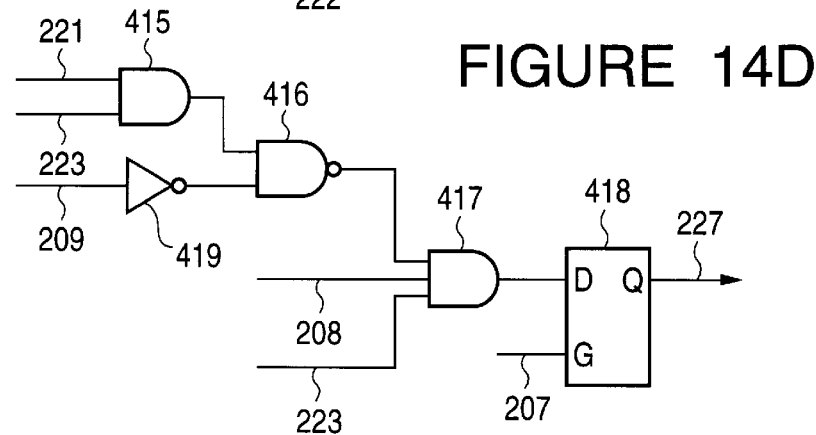

The fourth read/write bank selection signal generating circuit shown in FIG. 14D for generating the bank selection signal 227, includes a nineteenth AND gate 415 receiving the second bank activation signal 221 and the fourth bank activation signal 223, a thirteenth inverter 419 receiving the second internal bank selection signal 209, an eighth NAND gate 416 receiving an output of the nineteenth AND gate 415 and an output of the thirteenth inverter 419, a twentieth AND gate 417 receiving an output of the eighth NAND gate 416, the first internal bank selection signal 208 and the fourth bank activation signal 223, and a fourth D-latch circuit 418 latching an output of the twentieth AND gate 417 in response to the internal read/write command signal 207, for outputting the fourth read/write bank selection signal 227.

First, the reading operation in a 2-bank structure will be explained. In the 2-bank structure, as mentioned hereinbefore, of the four banks each including the memory cell array and the control circuit therefore, the banks 700 and 702 are combined to constitute the same bank, and similarly, the banks 701 and 703 are combined to constitute the same bank. Further, the bank selection is performed by only the logical value of the bank selection signal 200. Namely, when the bank selection signal 200 is at the logical low level, the first bank constituted of the groups 700 and 702 is selected, and when the bank selection signal 200 is at the logical high level, the second bank constituted of the groups 701 and 703 is selected. In this case, the bank selection signal 201 used as the bank selection signal in the 4-bank structure, is handled as the most significant bit of the row address signal, and is used as a selection address for partially operating the bank in the first bank (banks 700 and 702) or in the second bank (banks 701 and 703) in the memory cell array 101 when it is activated. In the following reading operation of the 2-bank structure, this bank selection signal 201 will be temporarily called an "address signal 201", and correspondingly, the internal bank selections signal 209 will be temporarily called an "internal address signal 209".

When the first bank is activated, if the address signal 201 is at the logical low level, the bank 700 of the memory cell array 101 is activated, and if the address signal 201 is at the logical high level, the bank 702 of the memory cell array 101 is activated. When the second bank is activated, if the address signal 201 is at the logical low level, the bank 701 of the memory cell array 101 is activated, and if the address signal 201 is at the logical high level, the bank 703 of the memory cell array 101 is activated. In the read/write operation and in the precharge operation, an invalid input value is supplied to the address signal 201.

Figure 10:
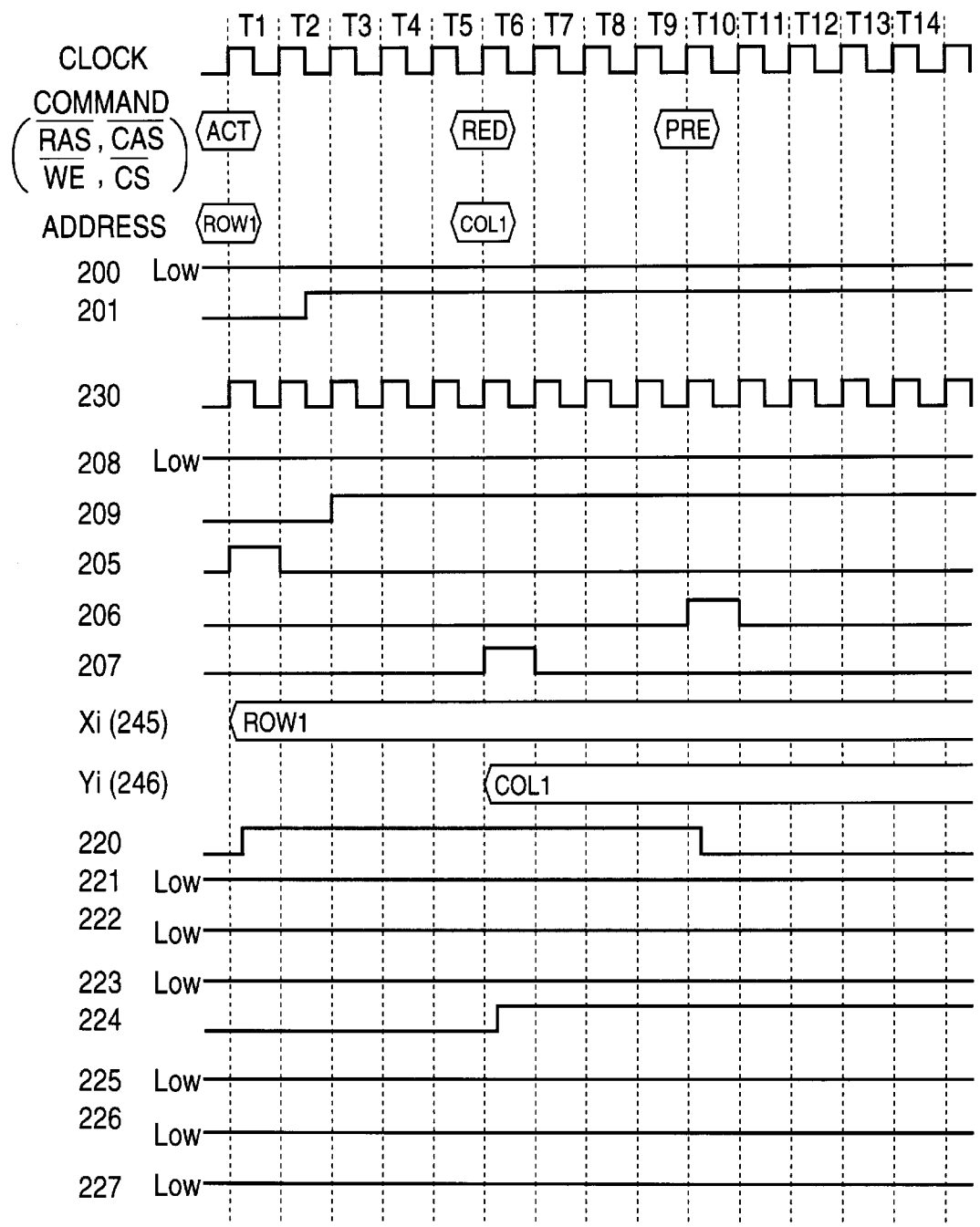
FIG. 10 is a timing chart illustrating an operation of the synchronous DRAM in the 2-bank structure.

As mentioned hereinbefore, FIG. 10 is a timing chart illustrating the operation of the synchronous DRAM in the 2-bank structure.

At a timing T1 in the timing chart of FIG. 10, an active external command is supplied, and simultaneously, the address signals Ai, 244, the address signal 201 of the logical low level and the bank selection signal 200 of the logical low level are fetched, so that in the first bank constituted of the banks 700 and 702, the bank 700 is activated.

Furthermore, in response to the bank selection signal 200 of the logical low level and the address signal 201 of the logical low level which are supplied from the external, the internal bank selection signal 208 and the internal address signal 209 are both brought to the logical low level, respectively.

In the bank activation signal generating circuitry 202 having the internal construction shown in FIGS. 13A, 13B, 13C and 13D, the internal precharge command signal 206 is at the logical low level. Furthermore, it is assumed that all the bank activation signals 220, 221, 222 and 223 are at the logical low level.

In this condition, in the first bank activation signal generating circuit shown in FIG. 13A, if the internal activation command signal 205 is brought to the logical high level, since the internal bank selection signal 208 is at the logical low level and the internal address signal 209 is at the logical low level, the output of the AND gate 301 is brought to the logical high level, and the output of the NOR gate 302 is brought to the logical low level, so that the output of the inverter 303 is brought to the logical high level, with the result the bank activation signal 220 is brought to the logical high level. On the other hand, since the internal precharge command signal 206 is at the logical low level, the output of the AND gate 305 is at the logical low level. Since the output of the NOR gate 302 is at the logical low level, the output of the NOR gate 306 is brought to the logical high level. Therefore, the output of the NOR gate 302 is maintained at the logical low level, regardless of the output level of the AND gate 301. Thus, the bank activation signal 220 is maintained at the logical high level.

At a rising of the clock signal in a timing T2 shown in FIG. 10, the internal activation command signal 205 is brought to the logical low level. Accordingly, the output of the AND gate 301 is brought to the logical low level. Simultaneously, since the row address value "ROW1" is supplied as the address signals Ai, 244, this row address value "ROW1" is transferred to the memory cell array 101 by the corresponding internal row address signals Xi, 245. The internal bank activation signal 220 of the logical high level is supplied to the bank 700 included in the first bank. Thus, the word line designated by the row address value "ROW1" is selected, so that data of a corresponding memory cell is amplified by the sense amplifier circuit.

Incidentally, at a timing T6 in the timing chart of FIG. 10, the external read command is inputted, and the bank selection signal 200 of the logical low level is inputted, so that the internal bank selection signal 208 is at the logical low level in accordance with the logical level of the bank selection signal 200.

The read/write bank selection signal generating circuitry 203 having the internal construction as shown in FIGS. 14A, 14B, 14C and 14D, receives the bank activation signal 220 of the logical high level generated in the first bank activation signal generating circuit shown in FIG. 13A, and the bank activation signals 221, 222 and 223 of the logical low level. In the 2-bank structure operation, both the first bank constituted of the banks 700 and 702 and the second bank constituted of the banks 701 and 703, are never activated at the same time, and one of the bank activation signals 220 and 222 and one of the bank activation signals 221 and 223 are necessarily at the logical low level.

In the first read/write bank selection signal generating circuit shown in FIG. 14A for the bank 700, the bank activation signals 220 and 222 are supplied to the AND gate 400, so that, in the 2-bank structure operation, an output of the AND gate 400 is necessarily at the logical low level. Therefore, an output of the NAND gate 401 receiving the internal bank selection signal 209 in accordance with the selection signal 201 for the first bank constituted of the banks 700 and 702, is fixed to the logical high level because of the logical low level output of the AND gate 400. Similarly, in the second, third and fourth read/write bank selection signal generating circuits shown in FIGS. 14B, 14C and 14D for the banks 701, 702 and 703, since an output of all the AND gates 405, 411 and 415 are at the logical low level, an output of all the NAND gates 406, 412 and 416 are fixed to the logical high level. Namely, the logical level of the internal address signal 209 corresponding to the external address signal 201 in the 2-bank structure operation, is never fetched as an effective value into the read/write bank selection signal generating circuitry 203, and therefore, gives no influence to an internal operation of the read/write bank selection signal generating circuitry 203.

Furthermore, since the internal bank selection signal 208 is at the logical low level, an output of both the inverters 404 and 410 are at the logical high level. Therefore, an output of the AND gate 402 is brought to the logical high level since the bank activation signal 220 is at the logical high level, but an output of the AND gate 407 is brought to the logical low level since the bank activation signal 222 is at the logical low level. An output of each of the AND gates 413 and 417 is at the logical low level, since the internal bank selection signal 208 is at the logical low level. The logical level outputted from the AND gates 402, 408, 413, 417 are latched in the corresponding D-latch circuits 403, 407, 414 and 418, respectively, in response to the internal read/write command signal 207, so that the internal read/write bank selection signal 224 of the logical high level and the internal read/write bank selection signals 226, 225 and 227 of the logical low level are outputted. In this situation, the column address value "COL1" of the internal column address signals Yi, 246 are simultaneously supplied as the address signals Ai, 244. Thus, the internal read/write bank selection signal 224 of the logical high level is supplied to the bank 700 included in the first bank, and data is read out from the memory cell at the column address designated by the column address value "COL1".

At a timing T10 shown in FIG. 10, the external precharge command is inputted, and the bank selection signal 200 is brought to the logical low level for the purpose of precharging the first bank. In this case, the internal precharge command signal 206 is brought to the logical high level, and the internal bank selection signal 208 is brought to the logical low level in accordance with the logical value of the bank selection signal 200.

In the bank activation signal generating circuitry 202 having the internal construction shown in FIGS. 13A, 13B, 13C and 13D, the bank activation signal 220 is at the logical high level, and the bank activation signals 221, 222 and 223 are at the logical low level. The bank activation signals 220 and 222 are supplied to the AND gate 307 in the first bank activation signal generating circuit shown in FIG. 13A for the bank 700, so that, in the 2-bank structure operation, an output of the AND gate 307 is necessarily at the logical low level. Therefore, an output of the NAND gate 308 receiving the internal bank selection signal 209 in accordance with the selection signal 201 for the first bank constituted of the banks 700 and 702, is fixed to the logical high level because of the logical low level output of the AND gate 307. Similarly, in the second, third and fourth bank activation signal generating circuits shown in FIGS. 13B, 13C and 13D for the banks 701, 702 and 703, since an output of all the AND gates 313, 320 and 329 are at the logical low level, an output of all the NAND gates 314, 321 and 331 are fixed to the logical high level.

Namely, in the 2-bank structure operation, the logical level of the internal address signal 209 is never fetched as an effective value into the bank activation signal generating circuitry 202, and therefore, gives no influence to an internal operation of the bank activation signal generating circuitry 202.

Furthermore, since the internal bank selection signal 208 is at the logical low level, an output of both the inverters 304 and 323 are at the logical high level. Since the bank activation signal 220 is at the logical high level, if the internal precharge command signal 206 is brought to the logical high level, an output of the AND gate 305 is brought to the logical high level, so that an output of the NOR gate 306 is brought to the logical low level. On the other hand, since the bank activation signal 222 is at the logical low level, even if the internal precharge command signal 206 is brought to the logical high level, an output of the AND gate 324 remains at the logical low level. Since the internal activation command signal 205 is at the logical low level, an output of the AND gate 301 is at the logical low level, so that an output of the NOR gate 302 is brought to the logical high level, and the inverter 303 is at the logical low level. Namely, the bank activation signal 220 becomes the logical low level. In addition, if the output of the NOR gate 302 is brought to the logical high level, the output of the NOR gate 306 is fixed to the logical low level. Thus, the bank activation signal 220 is maintained at the logical low level, regardless of the output logical level of the AND 305.

At a rising of the clock of a timing T11 in FIG. 10, the internal precharge command signal 206 is brought to the logical low level. Accordingly, the output of the AND gate 305 is brought to the logical low level. In the bank 700 of the first bank shown in FIG. 3, furthermore, since the bank activation signal 220 has been brought to the logical low level, the word line driver 806 is deactivated so as to bring the word line 807 to the logical low level. In addition, the sense amplifier circuit 811 is deactivated in response to the bank activation signal 220 of the logical low level, so that the digit lines 809 and 810 are precharged.

As mentioned above, in a read/write operation and in the precharge operation at the time of the 2-bank structure operation, since either of the first bank constituted of the banks 700 and 702 and the second bank constituted of the banks 701 and 703 is not activated, namely, since either of the bank activation signals 220 and 222 and either of the bank activation signals 221 and 223 are at the logical low level, the bank selection signal 201 for selectively operating either the banks 700 and 702 or the banks 701 and 703 in the 4-bank structure operation, and the internal bank selection signal 209 generated on the basis of the bank selection signal 201, are invalidated. As a result, in the same banks selected, the read/write operation and the precharge operation are executed for the bank activated by the bank activation signals 220, 221, 222 and 223.

Next, an operation of the synchronous DRAM in the 4-bank structure will be described. In the 4-bank structure, one of the banks 700, 701, 702 and 703 is selected by a specific logical value combination of the bank selection signals 200 and 201. Here, when both of the logical values of the bank selection signals 200 and 201 are at a logical low level, the bank 700 is selected, and when the logical values of the bank selection signals 200 and 201 are at a logical high level and at the logical low level, respectively, the bank 701 is selected. When the logical values of the bank selection signals 200 and 201 are at the logical low level and at the logical high level, respectively, the bank 702 is selected, and when both of the logical values of the bank selection signals 200 and 201 are at the logical high level, the bank 703 is selected.

Figure 5:
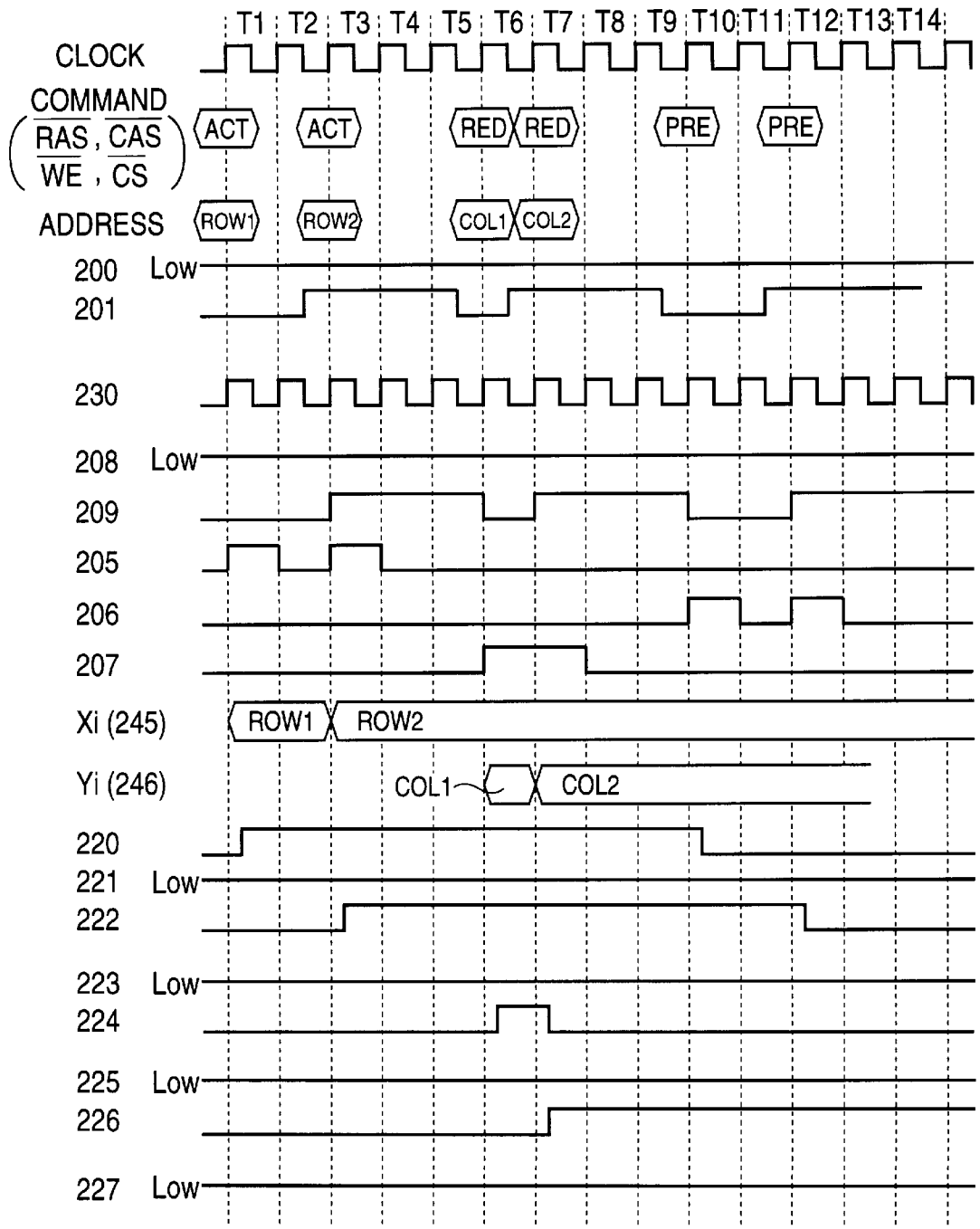
FIG. 5 is a timing chart illustrating an operation of the synchronous DRAM in the 4-bank structure.
Figure 6A:
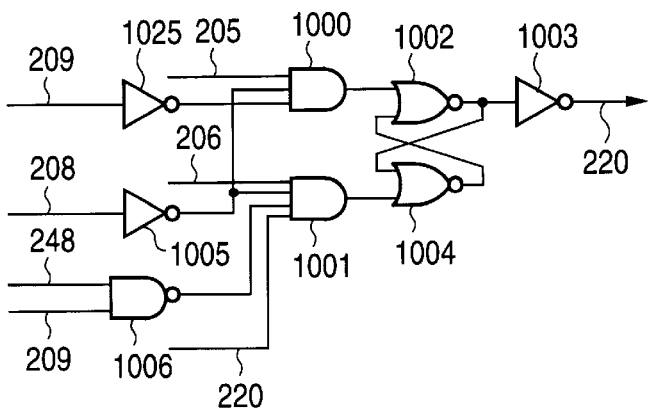
FIGS. 6A, 6B, 6C and 6D are logic circuit diagrams illustrating an internal construction of the bank activation signal generating circuitry shown in FIG. 4.
Figure 6B:
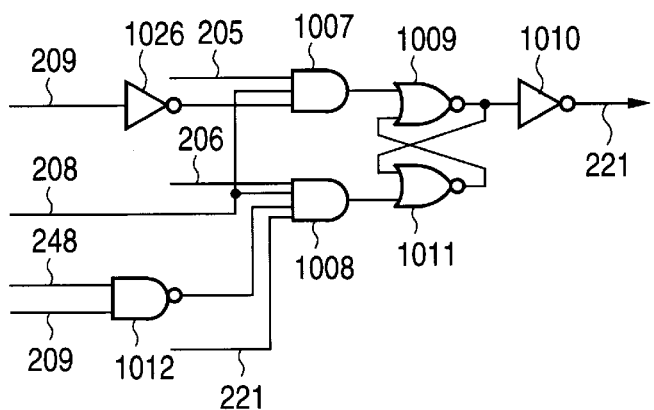
Figure 6C:
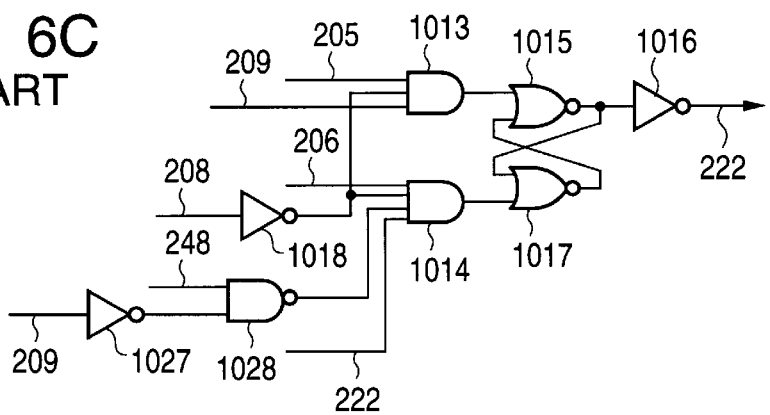
Figure 6D:
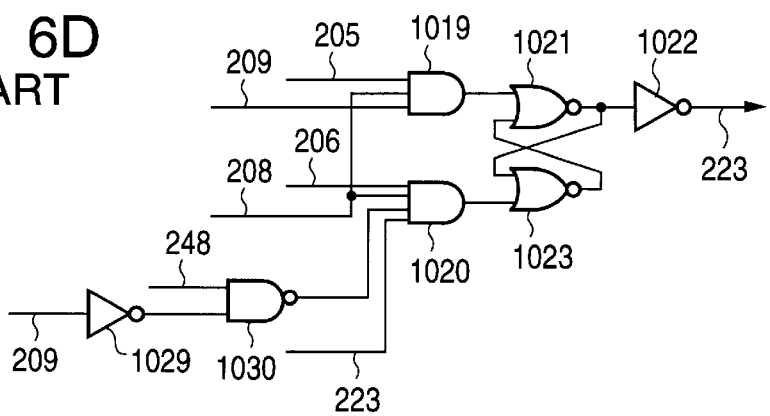

As mentioned hereinbefore, FIG. 5 shows a timing chart illustrating the operation of the synchronous DRAM in the 4-bank structure. At a timing T1 in the timing chart of FIG. 5, the active command (which is determined by a specific logical value combination of the $\overline{\text{RAS}}$ command signal 240, the $\overline{\text{CAS}}$ command signal 241, the $\overline{\text{WE}}$ command signal 242 and the $\overline{\text{CS}}$ command signal 243, also as mentioned hereinbefore) is fetched, and simultaneously, the address signals Ai, 244 and the bank selection signals 200 and 201 of the logical low level are fetched, so that the bank 700 designated by the bank selection signals 200 and 201 is activated.

In the internal construction of the bank control signal generating unit 100 shown in FIG. 12, the internal bank selection signal 208 and 209 are both brought to the logical low level in accordance with the logical level of the external bank selection signals 200 and 201

In the bank activation signal generating circuitry 202 having the internal construction shown in FIGS. 13A, 13B, 13C and 13D, the internal precharge command signal 206 is at the logical low level. Furthermore, it is assumed that all the bank activation signals 220, 221, 222 and 223 are at the logical low level.

In this condition, if the internal activation command signal 205 is brought to the logical high level, since both the internal bank selection signals 208 and 209 are at the logical low level, in the first bank activation signal generating circuit shown in FIG. 13A, the output of the AND gate 301 is brought to the logical high level, and the output of the NOR gate 302 is brought to the logical low level, so that the output of the inverter 303 is brought to the logical high level, with the result that the bank activation signal 220 is brought to the logical high level. On the other hand, since the internal precharge command signal 206 is at the logical low level, the output of the AND gate 305 is at the logical low level, so that the output of the NOR gate 306 is brought to the logical high level. Therefore, the output of the NOR gate 302 is maintained at the logical low level, regardless of the output level of the AND gate 301. Thus, the bank activation signal 220 is maintained at the logical high level.

At a rising of the clock signal in a timing T2 shown in FIG. 10, the internal activation command signal 205 is brought to the logical low level. Accordingly, the output of the AND gate 301 is brought to the logical low level.

At the timing T1 in the timing chart of FIG. 10, since the row address value "ROW1" is supplied as the address signals Ai, 244, this row address value "ROW1" is transferred to the memory cell array 101 by the corresponding internal row address signals Xi, 245. The internal bank activation signal 220 of the logical high level is supplied to the bank 700. Thus, the word line designated by the row address value "ROW1" is selected, so that data of a corresponding memory cell is amplified by the sense amplifier circuit.

At a timing T3 in the timing chart of FIG. 5, the active command signals are inputted again, and the bank selection signal 200 of the logical low level and the bank selection signal 201 of the logical high level are fetched so that the internal bank selection signal 208 and the internal bank selection signal 209 are brought to the logical low level and the logical high level, respectively, for the purpose of activating the bank 702.

In the bank activation signal generating circuitry 202 having the internal construction shown in FIGS. 13A, 13B, 13C and 13D, if the internal activation command signal 205 is brought to the logical high level, an output of the AND gate 317 in the third bank activation signal generating circuit shown in FIG. 13C for the bank 702, is brought to the logical high level. Therefore, an output of the NOR gate 318 is brought to the logical low level, so that an output of the inverter 319 is brought to the logical high level, with the result that the bank activation signal 222 is brought to the logical high level. On the other hand, since the internal precharge command signal 206 is at the logical low level, an output of the AND gate 324 is at the logical low level. As mentioned above, since the output of the NOR gate 318 is at the logical low level, an output of the NOR gate 325 is brought to the logical high level.

Therefore, the output of the NOR gate 318 is maintained at the logical low level, regardless of the output level of the AND gate 317. Thus, the bank activation signal 222 is maintained at the logical high level.

At this time, as shown in the timing chart of FIG. 5, since the row address value "ROW2" is supplied as the address signal Ai, 244, the row address value "ROW2" is transferred as the internal row address signal 245 to the memory cell array 101. The bank activation signal 222 of the logical high level is supplied to the bank 702, and the word line corresponding to the row address value "ROW2" is selected, so that data of a corresponding memory cell is amplified by the associated sense amplifier.

At a rising of the clock signal in a timing T4 shown in FIG. 5, the internal activation command signal 205 is brought to the logical low level, so that the output of the AND gate 317 is brought to the logical low level.

At a timing T6 in the timing chart of FIG. 5, a read command is inputted, the address signals Ai, 244 and the bank selection signals 200 and 201 of the logical low level are fetched, so that both the corresponding internal bank selection signals 208 and 209 are brought to the logical low level, with the result that the bank 700 is activated for the purpose of reading data from the bank 700.

In the read/write bank selection signal generating circuit 203 having the internal construction shown in FIGS. 14A, 14B, 14C and 14D, the bank activation signals 220 and 222 are at the logical high level and the bank activation signals 221 and 223 are at the logical low level. In the case of the 4-bank structure operation, there is possibility that all of the four banks 700, 701, 702 and 703 are activated. In this situation, of course, all the bank activation signals 220, 221, 222 and 223 are brought to the logical high level.

In the read/write bank selection signal generating circuitry 203 having the internal construction as shown in FIGS. 14A, 14B, 14C and 14D, the bank activation signals 220 and 222 are supplied to the AND gates 400 and 405, respectively, in the first and third read/write bank selection signal generating circuits shown in FIGS. 14A and 14C for the banks 700 and 702. In the 4-bank structure operation, therefore, when both the banks 700 and 702 in the memory cell array 101 are activated, the output of both the AND gates 400 and 405 are brought to the logical high level, so that the internal bank selection signal 209 corresponding to the bank selection signal 201 is fetched as an effective value into the read/write bank selection signal generating circuitry 203. At this time, either the bank 700 or 702 is alternatively put into an operating condition, dependently upon the logical value of the bank selection signal 201.

Similarly when both the banks 701 and 703 in the memory cell array 101 are activated, in the second and fourth read/write bank selection signal generating circuits shown in FIGS. 14B and 14D for the banks 701 and 703, the output of both the AND gates 411 and 415 are brought to the logical high level, so that the internal bank selection signal 209 corresponding to the bank selection signal 201 is fetched as an effective value into the read/write bank selection signal generating circuitry 203. At this time, either the bank 701 or 703 is alternatively put into an operating condition, dependently upon the logical value of the bank selection signal 201.

In a condition that both of the banks 700 and 702 or both of the banks 701 and 702 are not activated together in the memory cell array 101, one of the bank activation signals 220 and 222 or one of the bank activation signals 221 and 223 is at the logical low level. Accordingly, similarly to the 2-bank structure operation, the output of the AND gates 400 and 405 and the output of the AND gates 411 and 415 are at the logical low level, the internal bank selection signal 209 corresponding to the bank selection signal 201 is never fetched as an effective value into the read/write bank selection signal generating circuitry 203. Accordingly, the read/write operation is executed for only the bank which is activated by one of the bank activation signals 220 and 222 or one of the bank activation signals 221 and 223. Here, however, it would be apparent that the bank selected by the bank selection signal 201 is only either the activated bank of the banks 700 and 702 or the activated bank of the banks 701 and 703, and therefore, there is no problem in the operation of the synchronous DRAM.

In this case, since the internal bank selection signal 209 is at the logical low level, the output of the NAND gate 401 shown in FIG. 14A is brought to the logical high level, and the output of the NAND gate 406 shown in FIG. 14C is brought to the logical low level. Accordingly, the output of the AND gate 402 is at the logical high level, and the output of the AND gate 407 is at the logical low level. In addition, the output of the AND gates 413 and 417 shown in FIGS. 14B and 14D is at the logical low level. Thus, the output of the AND gates 402, 407, 413 and 417 are latched in the D-latch circuits 403, 408, 414 and 418, respectively, in response to the internal read/write command signal 207. Therefore, the bank selection signal 224 of the logical high level and the bank selection signals 225, 226 and 227 of the logical low level are outputted.

In this situation, since the column address value "COL1" is simultaneously supplied as the address signals Ai, the column address value "COL1" is transferred as the internal column address signal Yi, 246 to the memory cell array 101. The internal read/write bank selection signal 224 of the logical high level is supplied to the bank 700, and data is read out from the memory cell corresponding to the column address designated by the column address value "COL1".

At a timing T7 in the timing chart of FIG. 5, a read command is inputted again, the bank selection signal 200 of the logical low level and the bank selection signal 201 of the logical high level are fetched, so that the corresponding internal bank selection signals 208 and 209 are brought to the logical low level and the logical high level, respectively, with the result that the bank 702 is activated for the purpose of reading data from the bank 702.

In the read/write bank selection signal generating circuit 203 having the internal construction shown in FIGS. 14A, 14B, 14C and 14D, since the bank activation signals 220 and 222 are at the logical high level, the output of both the AND gates 400 and 405 are brought to the logical high level. As a result, the internal bank selection signal 209 corresponding to the bank selection signal 201 is fetched as an effective value into the read/write bank selection signal generating circuitry 203. Since the internal bank selection signals 208 and 209 are at the logical low level and at the logical high level, respectively, the output of the AND gate 407 is brought to the logical high level, and the output of the AND gate 402 is brought to the logical low level. In addition, the output of the AND gates 413 and 417 shown in FIGS. 14B and 14D are at the logical low level. The output of the AND gates 402, 407, 413 and 417 are latched in the D-latch circuits 403, 408, 414 and 418, respectively, in response to the internal read/write command signal 207. Therefore, the bank selection signal 226 of the logical high level and the bank selection signal 224 of the logical low level are outputted. The bank selection signals 225 and 227 remain at the logical low level.

In this situation, since the column address value "COL2" is simultaneously supplied as the address signals Ai, the column address value "COL2" is transferred as the internal column address signal Yi, 246 to the memory cell array 101. The internal read/write bank selection signal 226 of the logical high level is supplied to the bank 702, and data is read out from the memory cell corresponding to the column address designated by the column address value "COL2".

At a timing T10 shown in FIG. 5, the external precharge command is inputted, and the bank selection signals 200 and 201 of the logical low level are fetched, so that both the corresponding internal bank selection signals 208 and 209 are brought to the logical low level, for the purpose of precharging the first bank 700.

In the bank activation signal generating circuitry 202 having the internal construction shown in FIG. 13A, 13B, 13C and 13D, the bank activation signals 220 and 222 are at the logical high level and the bank activation signals 221 and 223 are at the logical low level. When the banks 700 and 702 or the banks 701 and 703 are activated simultaneously, both the bank activation signals 220 and 222 or both the bank activation signals 221 and 223 are at the logical high level. In the first and third bank activation signal generating circuit shown in FIGS. 13A and 13C, the bank activation signals 220 and 222 are supplied to the AND gates 307 and 320, respectively. Accordingly, the banks 700 and 702 are activated in the memory cell array 101. Since the output of the AND gates 307 and 320 are at the logical high level, the logical value of the internal address signal 209 corresponding to the external address signal 201 is fetched as an effective value. At this time, either the bank 700 or the bank 702 is alternatively put into the operating condition, dependently upon the logical value of the bank selection signal 201. Similarly, when the both of the banks 701 and 703 in the memory cell array 101 are in the activated condition, the output of both the AND gates 313 and 329 in the second and fourth bank activation signal generating circuit shown in FIGS. 13B and 13D are at the logical high level, so that the logical value of the internal address signal 209 corresponding to the external address signal 201 is fetched as an effective value. At this time, either the bank 701 or the bank 703 is alternatively put into the operating condition, dependently upon the logical value of the bank selection signal 201.

When both of the banks 700 and 702 or both of the banks 701 and 703 are never activated at the same time, one of the bank activation signals 220 and 222 and one of the bank activation signals 221 and 222 are necessarily at the logical low level. Similarly to the 2-bank structure operation, accordingly, an output of both the AND gates 307 and 320 or an output of both the AND gates 313 and 329 are at the logical low level, so that the logical level of the internal address signal 209 corresponding to the bank selection signal 201 is never fetched as an effective value, and the precharge operation is executed for the bank activated by the activated one of the bank activation signals 220 and 222 or the activated one of the bank activation signals 221 and 223. In this case, however, since the bank selected by the bank selection signal 201 is only either the activated bank of the banks 700 and 702 or the activated bank of the banks 701 and 703, there is no problem in the operation of the synchronous DRAM.

In the bank activation signal generating circuitry 202 having the internal construction shown in FIGS. 13A, 13B, 13C and 13D, if the internal precharge command signal 206 is brought to the logical high level, since both the internal bank selection signals 208 and 209 are at the logical low level, the output of the AND gate 305 is brought to the logical high level, so that an output of the NOR gate 306 is brought to the logical low level. On the other hand, since the internal activation command signal 205 is at the logical low level, the output of the AND gate 301 is at the logical low level, so that an output of the NOR gate 302 is brought to the logical high level, and the inverter 303 is at the logical low level. Namely, the bank activation signal 220 becomes the logical low level. In addition, if the output of the NOR gate 302 is brought to the logical high level, since the output of the NOR gate 306 is fixed to the logical low level, the bank activation signal 220 is maintained at the logical low level, regardless of the output logical level of the AND 305.

At a rising of the clock of a timing T11 in FIG. 10, the internal precharge command signal 206 is brought to the logical low level. Accordingly, in the circuit shown in FIG. 3 for the bank 700, since the bank activation signal 220 has been brought to the logical low level, the word line driver 806 is deactivated so as to bring the word line 807 to the logical low level. In addition, the sense amplifier circuit 811 is deactivated in response to the bank activation signal 220 of the logical low level, so that the digit lines 809 and 810 are precharged.

At a timing T12 shown in FIG. 5, the external precharge command is inputted again, and the bank selection signal 200 of the logical low level and the bank selection signal 201 of the logical high level are fetched, so that the corresponding internal bank selection signals 208 and 209 are brought to the logical low level and the logical high level, respectively, for the purpose of precharging the first bank 702. At this time, the bank activation signal 222 is brought to the logical high level and the bank activation signals 220, 221 and 223 are brought to the logical low level.

In the bank activation signal generating circuitry 202 having the internal construction shown in FIG. 13A, 13B, 13C and 13D, accordingly, the output of all the AND gates 307, 313, 320 and 329 are at the logical low level, so that the output of all the NAND gates 308, 314, 321 and 331 are fixed at the logical high level. As a result, the logical value of the internal address signal 209 corresponding to the external address signal 201 is not fetched as an effective value.

In addition, since the internal bank selection signal 208 is at the logical low level, the output of both the inverters 304 and 323 are at the logical high level. Since the bank activation signal 222 is at the logical high level, if the internal precharge command signal 206 is brought to the logical high level, the output of the AND gate 324 is brought to the logical high level, so that the output of the NOR gate 325 is brought to the logical low level. On the other hand, since the bank activation signal 220 is at the logical low level, even if the internal precharge command signal 206 is brought to the logical high level, the output of the AND gate 305 remains at the logical low level. Since the internal activation command signal 205 is at the logical low level, the output of the AND gate 317 is at the logical low level, so that the output of the NOR gate 318 is at the logical high level, and the output of the inverter 319 is at the logical low level, with the result that the bank activation signal 222 is brought to the logical low level. If the output of the NOR gate 318 is brought to the logical high level, the output of the NOR gate 325 is fixed to the logical low level, so that the bank activation signal 222 is maintained at the logical low level, regardless of the output logical level of the AND gate 324.

At a rising of the clock of a timing T13 in FIG. 10, the internal precharge command signal 206 is brought to the logical low level, so that the output of the AND gate 324 is brought to the logical low level. Accordingly, in the circuit shown in FIG. 3 for the bank 702, since the bank activation signal 222 has been brought to the logical low level, the word line driver 806 is deactivated so as to bring the word line 807 to the logical low level. In addition, the sense amplifier circuit 811 is deactivated in response to the bank activation signal 220 of the logical low level, so that the digit lines 809 and 810 are precharged.

As mentioned above, in a read/write operation and in the precharge operation at the time of the 4-bank structure operation, both of the banks 700 and 702 alternatively driven by the bank selection signal 201 or both of the banks 701 and 703 alternatively driven by the bank selection signal 201 are activated together. In other words, both of the bank activation signals 220 and 222 or both of the bank activation signals 221 and 223 are brought to the logical high level. As a result, the logical value of the internal bank selection signal 209 corresponding to the bank selection signal 201 is fetched as an effective value, so that the banks 700 and 702 or the banks 701 and 702 are selected and put in an operating condition. On the other hand, when one of the banks 700 and 702 alternatively driven by the bank selection signal 201 or one of the banks 701 and 703 alternatively driven by the bank selection signal 201 is not activated, one of the bank activation signals 220 and 222 or one of the bank activation signals 221 and 223 is at the logical low level, the logical value of the internal bank selection signal 209 corresponding to the bank selection signal 201 is not fetched as an effective value. In this case, the selection operation to be made by the bank selection signal 201 is executed by the bank activation signals 220, 221, 222 and 223.

Accordingly, the synchronous DRAM in accordance with the present invention no longer requires the bank switching function by the special bank switching signal, and can be used in common to a different number of banks. In actual use, the synchronous DRAM can be selectively set from one bank number to another different bank number or vice versa. Accordingly, it is no longer necessary to previously determine the number of banks in the synchronous DRAM manufacturing process.

In the above mentioned embodiment, the synchronous DRAM has been so constructed that the memory cell array can be divided into either two banks or four banks, but the synchronous DRAM can be used in common to the 2-bank structure and the 4-bank structure and can be changed from the 2-bank structure to the 4-bank structure and vice versa. However, the present invention is in no way limited to only the embodiment which can be used in common to the 2-bank structure and the 4-bank structure, but can be, as a matter of course, applied to a synchronous DRAM so constructed that the memory cell array can be divided into two banks, four banks or eight banks, but the synchronous DRAM can be used in common to the 2-bank structure, the 4-bank structure and 8-bank structure and can be changed among the 2-bank structure, the 4-bank structure and 8-bank structure.

As seen from the above, the semiconductor memory in accordance with the present invention is characterized in that, on the basis of a predetermined logical processing conducted by referring to the activation condition of the banks which are objects of selection, the external bank selection signal is selectively validated or invalidated. With this feature, the read/write operation and the precharge operation can be realized both in the 4-bank structure operation and in the 2-bank structure operation, without using a special bank switching signal. Therefore, the synchronous DRAM fitted to the 4-bank structure and the 2-bank structure or to the 8-bank structure, the 4-bank structure and the 2-bank structure can be manufactured in the same manufacturing process. After the product is completed, the bank structure can be selected in accordance with an actual demand. Accordingly, production efficiency can be elevated.

The invention has thus been shown and described with reference to the specific embodiments. However, it should be noted that the present invention is no way limited to the details of the illustrated structures but changes and modifications may be made within the scope of the appended claims.

I claim:

1. A synchronous readable and writable semiconductor memory comprising:

a memory cell array constituted of a plurality of memory banks;

a bank control signal generating means receiving external active command signals including a row address strobe command signal, a column address strobe command signal, a write enable command signal and a chip select command signal, and external bank selection signals for selectively designating said plurality of memory banks, said bank control signal generating means generating a plurality of read/write bank selection signals and a plurality of bank activation signals for selectively operating said memory banks, to said memory cell array, said bank control signal generating means also generating an internal activation command signal and an internal read/write command signal; and an address signal generating means receiving external address signals and said internal command signal and said internal read/write command signal, for outputting an internal row address signal and an internal column address signal for a memory bank to be selected, to said memory cell array, said bank control signal generating means being configured to selectively operate at least one memory bank in at least a data read/write operation without receiving an external bank switching signal having a function of switching the number of memory banks, said bank control signal generating means capable of changing from a 2-memory bank structure to a 4-memory bank structure, and vice versa.

2. A synchronous readable and writable semiconductor memory claimed in claim 1 wherein said bank control signal generating means includes:

a first buffer circuit fetching said external active command signals in response to an internal clock signal, for outputting said external active command signals as internal command signals;

a command decode circuit receiving said internal command signals, for generating an internal precharge command signal, said internal activation command signal and said internal read/write command signal;

a second buffer circuit fetching said external bank selection signals in response to said internal clock signal, for outputting said external bank selection signals as internal bank selection signals;

a bank activation signal generating circuitry receiving said internal bank selection signals, said internal activation command signal and said internal precharge command signal, for generating bank activation signals for said memory banks, respectively; and a read/write bank selection signal generating circuitry receiving said internal bank selection signals, said internal read/write command signal and said bank activation signals, for generating read/write bank selection signals for said memory banks, respectively.

3. A synchronous readable and writable semiconductor memory claimed in claim 2, wherein said memory cell array is constituted of first, second, third and fourth memory banks;

wherein said second buffer circuit outputs first and second internal bank selection signals;

wherein said bank activation signal generating circuitry receiving said first and second internal bank selection signals, said internal activation command signal and said internal precharge command signal, said bank activation signal generating circuitry including first, second, third and fourth bank activation signal generating circuits for generating first, second, third and fourth bank activation signals for said first, second, third and fourth memory banks, respectively; and said read/write bank selection signal generating circuitry receiving said first and second internal bank selection signals, said internal read/write command signal and said first, second, third and fourth bank activation signals, said read/write bank selection signal generating circuitry including first, second, third and fourth read/write bank selection signal generating circuits for generating first, second, third and fourth read/write bank selection signals for said first, second, third and fourth memory banks, respectively.

4. A synchronous readable and writable semiconductor memory claimed in claim 3, wherein said first bank activation signal generating circuit includes;

a first AND gate receiving said first bank activation signal and said third bank activation signal;

a first NAND gate receiving an output of said first AND gate and said second internal bank selection signal;

a first inverter receiving said first internal bank selection signal;

a second inverter receiving said second internal bank selection signal;

a second AND gate receiving said internal activation command signal, an output of said first inverter and an output of said second inverter;

a third AND gate receiving said internal precharge command signal, said output of said first inverter, an output of said first NAND gate and said first bank activation signal;

a first NOR gate having a first input connected to an output of said second AND gate;

a second NOR gate having a first input connected to an output of said third AND gate and a second input connected to an output of said first NOR gate, an output of said second NOR gate being connected to a second input of said first NOR gate; and a third inverter receiving said output of said first NOR gate, an output of said third inverter outputting said first bank activation signal;

wherein said second bank activation signal generating circuit includes;

a fourth AND gate receiving said second bank activation signal and said fourth bank activation signal;

a second NAND gate receiving an output of said fourth AND gate and said second internal bank selection signal;

a fourth inverter receiving said second internal bank selection signal;
a fifth AND gate receiving said internal activation command signal, an output of said fourth inverter and said first internal bank selection signal;
a sixth AND gate receiving said internal precharge command signal, said first internal bank selection signal, an output of said second NAND gate and said second bank activation signal;
a third NOR gate having a first input connected to an output of said fifth AND gate;
a fourth NOR gate having a first input connected to an output of said sixth AND gate and a second input connected to an output of said third NOR gate, an output of said fourth NOR gate being connected to a second input of said third NOR gate; and
a fifth inverter receiving said output of said third NOR gate, an output of said fifth inverter outputting said second bank activation signal;
wherein said third bank activation signal generating circuit includes;
a seventh AND gate receiving said first bank activation signal and said third bank activation signal;
a sixth inverter receiving said second internal bank selection signal;
a third NAND gate receiving an output of said seventh AND gate and an output of said sixth inverter;
a seventh inverter receiving said first internal bank selection signal;
an eighth AND gate receiving said internal activation command signal, said second internal bank selection signal and an output of said seventh inverter;
a ninth AND gate receiving said internal precharge command signal, said output of said seventh inverter, an output of said third NAND gate and said third bank activation signal;
a fifth NOR gate having a first input connected to an output of said eighth AND gate;
a sixth NOR gate having a first input connected to an output of said ninth AND gate and a second input connected to an output of said fifth NOR gate, an output of said sixth NOR gate being connected to a second input of said fifth NOR gate; and
an eighth inverter receiving said output of said fifth NOR gate, an output of said eighth inverter outputting said third bank activation signal; and
wherein said fourth bank activation signal generating circuit includes;
a tenth AND gate receiving said second bank activation signal and said fourth bank activation signal;
a ninth inverter receiving said second internal bank selection signal;
a fourth NAND gate receiving an output of said tenth AND gate and an output of said ninth inverter;
an eleventh AND gate receiving said internal activation command signal, said first internal bank selection signal and said second internal bank selection signal;
a twelfth AND gate receiving said internal precharge command signal, said first internal bank selection signal, an output of said fourth NAND gate and said fourth bank activation signal;
a seventh NOR gate having a first input connected to an output of said eleventh AND gate;
an eighth NOR gate having a first input connected to an output of said twelfth AND gate and a second input connected to an output of said eleventh NOR gate, an output of said twelfth NOR gate being connected to a second input of said eleventh NOR gate; and
a ninth inverter receiving said output of said eleventh NOR gate, an output of said ninth inverter outputting said fourth bank activation signal.

5. A synchronous readable and writable semiconductor memory claimed in claim 4,
wherein said first read/write bank selection signal generating circuit includes;
a thirteenth AND gate receiving said first bank activation signal and said third bank activation signal;
a fifth NAND gate receiving said second internal bank selection signal and an output of said thirteenth AND gate;
a tenth inverter receiving said first internal bank selection signal;
a fourteenth AND gate receiving an output of said fifth NAND gate, an output of said tenth inverter and said first bank activation signal; and
a first D-latch circuit latching an output of said fourteenth AND gate in response to said internal read/write command signal, for outputting said first read/write bank selection signal,
wherein said second read/write bank selection signal generating circuit includes;
a fifteenth AND gate receiving said second bank activation signal and said fourth bank activation signal;
a sixth NAND gate receiving said second internal bank selection signal and an output of said fifteenth AND gate;
a sixteenth AND gate receiving said first internal bank selection signal, an output of said sixth NAND gate and said second bank activation signal; and
a second D-latch circuit latching an output of said sixteenth AND gate in response to said internal read/write command signal, for outputting said second read/write bank selection signal,
wherein said third read/write bank selection signal generating circuit includes;
a seventeenth AND gate receiving said first bank activation signal and said third bank activation signal;
an eleventh inverter receiving said second internal bank selection signal;
a seventh NAND gate receiving an output of said seventeenth AND gate and an output of said eleventh inverter;
a twelfth inverter receiving said first internal bank selection signal;
an eighteenth AND gate receiving an output of said seventh NAND gate, an output of said twelfth inverter and said third bank activation signal; and
a third D-latch circuit latching an output of said eighteenth AND gate in response to said internal read/write command signal, for outputting said third read/write bank selection signal, and
wherein said fourth read/write bank selection signal generating circuit includes;
a nineteenth AND gate receiving said second bank activation signal and said fourth bank activation signal;
a thirteenth inverter receiving said second internal bank selection signal;
an eighth NAND gate receiving an output of said nineteenth AND gate and an output of said thirteenth inverter;
a twentieth AND gate receiving an output of said eighth NAND gate, said first internal bank selection signal and said fourth bank activation signal; and
a fourth D-latch circuit latching an output of said twentieth AND gate in response to said internal read/write command signal, for outputting said fourth read/write bank selection signal.

6. A synchronous readable and writable semiconductor memory comprising:

a memory cell array constituted of a plurality of memory banks;

a bank control signal generating means receiving external active command signals including a row address strobe command signal, a column address strobe command signal, a write enable command signal and a chip select command signal, and external bank selection signals for selectively designating said plurality of memory banks, said bank control signal generating means generating a plurality of read/write bank selection signals and a plurality of bank activation signals for selectively operating said memory banks, to said memory cell array, said bank control signal generating means also generating an internal activation command signal and an internal read/write command signal; and an address signal generating means receiving external address signals and said internal command signal and said internal read/write command signal, for outputting an internal row address signal and an internal column address signal for a memory bank to be selected, to said memory cell array, said bank control signal generating means being configured to selectively operate at least one memory bank in at least a data read/write operation without receiving an external bank switching signal having a function of switching the number of memory banks;

wherein said bank control signal generating means includes:

a first buffer circuit fetching said external active command signals in response to an internal clock signal, for outputting said external active command signals as internal command signals;

a command decode circuit receiving said internal command signals, for generating an internal precharge command signal, said internal activation command signal and said internal read/write command signal;

a second buffer circuit fetching said external bank selection signals in response to said internal clock signal, for outputting said external bank selection signals as internal bank selection signals;

a bank activation signal generating circuitry receiving said internal bank selection signals, said internal activation command signal and said internal precharge command signal, for generating bank activation signals for said memory banks, respectively; and a read/write bank selection signal generating circuitry receiving said internal bank selection signals, said internal read/write command signal and said bank activation signals, for generating read/write bank selection signals for said memory banks, respectively;

wherein said memory cell array is constituted of first, second, third and fourth memory banks;

wherein said second buffer circuit outputs first and second internal bank selection signals;

wherein said bank activation signal generating circuitry receiving said first and second internal bank selection signals, said internal activation command signal and said internal precharge command signal, said bank activation signal generating circuitry including first, second, third and fourth bank activation signal generating circuits for generating first, second, third and fourth bank activation signals for said first, second, third and fourth memory banks, respectively; and said read/write bank selection signal generating circuitry receiving said first and second internal bank selection signals, said internal read/write command signal and said first, second, third and fourth bank activation signals, said read/write bank selection signal generating circuitry including first, second, third and fourth read/write bank selection signal generating circuits for generating first, second, third and fourth read/write bank selection signals for said first, second, third and fourth memory banks respectively;

wherein said first bank activation signal generating circuit includes;

a first AND gate receiving said first bank activation signal and said third bank activation signal;

a first NAND gate receiving an output of said first AND gate and said second internal bank selection signal;

a first inverter receiving said first internal bank selection signal;

a second inverter receiving said second internal bank selection signal;

a second AND gate receiving said internal activation command signal, an output of said first inverter and an output of said second inverter;

a third AND gate receiving said internal precharge command signal, said output of said first inverter, an output of said first NAND gate and said first bank activation signal;

a first NOR gate having a first input connected to an output of said second AND gate;

a second NOR gate having a first input connected to an output of said third AND gate and a second input connected to an output of said first NOR gate, an output of said second NOR gate being connected to a second input of said first NOR gate; and a third inverter receiving said output of said first NOR gate, an output of said third inverter outputting said first bank activation signal;

wherein said second bank activation signal generating circuit includes;

a fourth AND gate receiving said second bank activation signal and said fourth bank activation signal;

a second NAND gate receiving an output of said fourth AND gate and said second internal bank selection signal;

a fourth inverter receiving said second internal bank selection signal;

a fifth AND gate receiving said internal activation command signal, an output of said fourth inverter and said first internal bank selection signal;

a sixth AND gate receiving said internal precharge command signal, said first internal bank selection signal, an output of said second NAND gate and said second bank activation signal;

a third NOR gate having a first input connected to an output of said fifth AND gate;

a fourth NOR gate having a first input connected to an output of said sixth AND gate and a second input connected to an output of said third NOR gate, an output of said fourth NOR gate being connected to a second input of said third NOR gate; and a fifth inverter receiving said output of said third NOR gate, an output of said fifth inverter outputting said second bank activation signal;

wherein said third bank activation signal generating circuit includes;

a seventh AND gate receiving said first bank activation signal and said third bank activation signal;

a sixth inverter receiving said second internal bank selection signal;

a third NAND gate receiving an output of said seventh AND gate and an output of said sixth inverter;

a seventh inverter receiving said first internal bank selection signal;

an eighth AND gate receiving said internal activation command signal, said second internal bank selection signal and an output of said seventh inverter;

a ninth AND gate receiving said internal precharge command signal, said output of said seventh inverter, an output of said third NAND gate and said third bank activation signal;

a fifth NOR gate having a first input connected to an output of said eighth AND gate;

a sixth NOR gate having a first input connected to an output of said ninth AND gate and a second input connected to an output of said fifth NOR gate, an output of said sixth NOR gate being connected to a second input of said fifth NOR gate; and an eighth inverter receiving said output of said fifth NOR gate, an output of said eighth inverter outputting said third bank activation signal; and wherein said fourth bank activation signal generating circuit includes;

a tenth AND gate receiving said second bank activation signal and said fourth bank activation signal;

a ninth inverter receiving said second internal bank selection signal;

a fourth NAND gate receiving an output of said tenth AND gate and an output of said ninth inverter;

an eleventh AND gate receiving said internal activation command signal, said first internal bank selection signal and said second internal bank selection signal;

a twelfth AND gate receiving said internal precharge command signal, said first internal bank selection signal, an output of said fourth NAND gate and said fourth bank activation signal;

a seventh NOR gate having a first input connected to an output of said eleventh AND gate;

an eighth NOR gate having a first input connected to an output of said twelfth AND gate and a second input connected to an output of said eleventh NOR gate, an output of said twelfth NOR gate being connected to a second input of said eleventh NOR gate; and a ninth inverter receiving said output of said eleventh NOR gate, an output of said ninth inverter outputting said fourth bank activation signal.

7. A synchronous readable and writable semiconductor memory as claimed in claim 6, wherein said first read/write bank selection signal generating circuit includes;

a thirteenth AND gate receiving said first bank activation signal and said third bank activation signal;

a fifth NAND gate receiving said second internal bank selection signal and an output of said thirteenth AND gate;

a tenth inverter receiving said first internal bank selection signal;

a fourteenth AND gate receiving an output of said fifth NAND gate, an output of said tenth inverter and said first bank activation signal; and a first D-latch circuit latching an output of said fourteenth AND gate in response to said internal read/write command signal, for outputting said first read/write bank selection signal, wherein said second read/write bank selection signal generating circuit includes;

a fifteenth AND gate receiving said second bank activation signal and said fourth bank activation signal;

a sixth NAND gate receiving said second internal bank selection signal and an output of said fifteenth AND gate;

a sixteenth AND gate receiving said first internal bank selection signal, an output of said sixth NAND gate and said second bank activation signal; and a second D-latch circuit latching an output of said sixteenth AND gate in response to said internal read/write command signal, for outputting said second read/write bank selection signal, wherein said third read/write bank selection signal generating circuit includes;

a seventeenth AND gate receiving said first bank activation signal and said third bank activation signal;

an eleventh inverter receiving said second internal bank selection signal;

a seventh NAND gate receiving an output of said seventeenth AND gate and an output of said eleventh inverter;

a twelfth inverter receiving said first internal bank selection signal;

an eighteenth AND gate receiving an output of said seventh NAND gate, an output of said twelfth inverter and said third bank activation signal; and a third D-latch circuit latching an output of said eighteenth AND gate in response to said internal read/write command signal, for outputting said third read/write bank selection signal, and wherein said fourth read/write bank selection signal generating circuit includes;

a nineteenth AND gate receiving said second bank activation signal and said fourth bank activation signal;

a thirteenth inverter receiving said second internal bank selection signal;

an eighth NAND gate receiving an output of said nineteenth AND gate and an output of said thirteenth inverter;

a twentieth AND gate receiving an output of said eighth NAND gate, said first internal bank selection signal and said fourth bank activation signal; and a fourth D-latch circuit latching an output of said twentieth AND gate in response to said internal read/write command signal, for outputting said fourth read/write bank selection signal.

* * * * *